US011681059B1

(12) United States Patent
Tsai et al.

(10) Patent No.: US 11,681,059 B1
(45) Date of Patent: Jun. 20, 2023

(54) SENSITIVE AND ROBUST THIN FILM X-RAY DETECTOR USING 2D LAYERED PEROVSKITE DIODES

(71) Applicant: Triad National Security, LLC, Los Alamos, NM (US)

(72) Inventors: Hsinhan Tsai, Los Alamos, NM (US); Wanyi Nie, Los Alamos, NM (US)

(73) Assignee: TRIAD NATIONAL SECURITY, LLC, Los Alamos, NM (US)

( * ) Notice: Subject to any disclaimer, the term of this patent is extended or adjusted under 35 U.S.C. 154(b) by 0 days.

(21) Appl. No.: 17/489,645

(22) Filed: Sep. 29, 2021

Related U.S. Application Data

(60) Provisional application No. 63/085,089, filed on Sep. 29, 2020.

(51) Int. Cl.
*G01T 1/20* (2006.01)
*G01T 1/202* (2006.01)
*C30B 29/54* (2006.01)

(52) U.S. Cl.
CPC ........... *G01T 1/2023* (2013.01); *C30B 29/54* (2013.01); *G01T 1/20181* (2020.05)

(58) Field of Classification Search
CPC .... G01T 1/2023; G01T 1/20181; C30B 29/54
See application file for complete search history.

(56) References Cited

U.S. PATENT DOCUMENTS 10,770,239 B1   9/2020  Mohite et al.
2016/0248028 A1*  8/2016  Huang ................ H01L 51/0002

OTHER PUBLICATIONS

Sergeii Yakunin et al., Detection of X-ray photons by solution-processed organic-inorganic perovskites, Nat Photonics. Jul. 2015 ; 9 (7): 444-449. doi:10.1038/nphoton.2015.82. (Year: 2015).*
Basiricò, L., et al., "Solution-Grown Organic and Perovskite X-Ray Detectors: A New Paradigm for the Direct Detection of Ionizing Radiation," *Advanced Materials Technologies*, 6(1), 2000475 (2021).
Bergamaschi, A. et al., "X-ray Detector Development at the Swiss Light Source," *Synchrotron Radiation News*, 27:4, 3-8, 001:10.1080/08940886.2014.930790, (2014).
Blancon, J.C., et al., "Extremely efficient internal exciton dissociation through edge states in layered 2D perovskites," *Science* 355, 1288-1292 (2017).
Burgelman, M. et al. "Admittance spectroscopy of thin film solar cells," *Solid State Ion*. 176, 2171-2175 (2005).
Cao, Duyen H. et al., "2D Homologous Perovskites as Light-Absorbing Materials for Solar Cell Applications", *Journal of the American Chemical Society* 2015, 137 (24), 7843-7850.

(Continued)

*Primary Examiner* — Hugh Maupin
(74) *Attorney, Agent, or Firm* — Lewis Roca Rothgerber Christie LLP

(57) ABSTRACT

A radiation detector includes a p-i-n architecture including a p-type contact layer, an n-type contact layer, and an intrinsic layer between the p-type contact layer and the n-type contact layer. The intrinsic layer includes a thin film comprising a highly crystalline 2D layered perovskite material. The radiation detectors according to embodiments of the present disclosure generate high open circuit voltages, have good detecting photon density limits and high sensitivities, and can be self-powered.

17 Claims, 24 Drawing Sheets
(24 of 24 Drawing Sheet(s) Filed in Color)

(56) References Cited

OTHER PUBLICATIONS

Chabbal, Jean, et al., "*Amorphous silicon x-ray image sensor,*" Medical Imaging 1996 (SPIE, 1996), vol. 2708.

Cowen, A. R. et al., "Solid-state, flat-panel, digital radiography detectors and their physical imaging characteristics," Clinical Radiology, 63, 487-498 (2008).

Demchyshyn, S., et al., "Designing Ultraflexible Perovskite X-Ray Detectors through Interface Engineering," Advanced Science 7, 2002586, (2020).

Durie, Brian G., et al., "High Speed Scintillation Autoradiography," *Science* 190, 1093 (1975).

Grancini, Giulia, et al., "Dimensional tailoring of hybrid perovskites for photovoltaics," Nature Reviews Materials 4, No. 1, Jan. 2019, pp. 4-22.

Green, Martin A., et al., "The emergence of perovskite solar cells," Nature Photonics, Review Article, vol. 8, Jul. 2014, pp. 506-514.

Gullikson, E. M., et al., "Stable silicon photodiodes for absolute intensity measurements in the VUV and soft X-ray regions," *J. Electron. Spectrosc.* 80, 313-316 (1996).

Hatsui, T., et al., "X-ray imaging detectors for synchrotron and XFEL sources," *IUCrJ* 2, 371-383 (2015).

Hegedus, Steven S., et al., "Thin-Film Solar Cells: Device Measurements and Analysis," *Progress in Photovoltaics: Research and Applications*, 12, 155-176 (2004).

Hoffman, J. M., et al., "In Situ Grazing-Incidence Wide-Angle Scattering Reveals Mechanisms for Phase Distribution and Disorientation in 2D Halide Perovskite Films," Advanced Materials 32, 2002812 (2020).

Hoheisel, Martin, "Review of medical imaging with emphasis on X-ray detectors," Nuclear Instruments and Methods in Physics Research A 563, 215-224 (2006).

Irvine, John, et al., "Perceived X-ray Image Quality for Baggage Screening," *2015 IEEE Applied Imagery Pattern Recognition Workshop (AIPR)*. (2015), pp. 1-9.

Jiang, Zhang "GIXSGUI: a MATLAB toolbox for grazing-incidence X-ray scattering data visualization and reduction, and indexing of buried three-dimensional periodic nanostructured films," *Journal of Applied Crystallography* 48, 917-926 (2015).

Jiang, Z., et al., "The dedicated high-resolution grazing-incidence X-ray scattering beamline 8-ID-E at the Advanced Photon Source," Journal of Synchrotron Radiation 19, 627-636 (2012).

Johns, H. E et al., *The Physics of Radiology, Fourth Ed.* (Charles Thomas, Springfield, Illinois, 1983), pp. 261-263.

Kasap, S. O., et al., "Direct-Conversion Flat-Panel X-Ray Image Sensors for Digital Radiography," *Proc. IEEE*, vol. 90, No. 4, 591-604 (2002).

Kim, Y. C., et al. "Printable organometallic perovskite enables large-area, low-dose X-ray imaging," *Nature*, vol. 550, 87 (2017), 10 pages.

Klein, Claude A., "Bandgap Dependence and Related Features of Radiation Ionization Energies in Semiconductors," *Journal of Applied Physics*, 39, 2029-2038 (1968).

Koster, L. J. A., et al., "Light intensity dependence of open-circuit voltage of polymer:fullerene solar cells," *Appl. Phys. Lett.* 86, 123509 (2005), 4 pages.

Lei, P., et al., "Determination of X-ray detection limit and applications in perovskite X-ray detectors," Nature Communications (2021).

Lian, Z., et al., "High-Performance Planar-Type Photodetector on (100) Facet of MAPbI$_3$ Single Crystal," *Scientific Reports* 5(1), 16563 (2015), pp. 1-10.

Liang, C., et al., "Two-dimensional Ruddlesden-Popper layered perovskite solar cells based on phase-pure thin films," Nature Energy 6, 38-45 (2021).

Liu, Z., et al., "Open-Circuit Voltages Exceeding 1.26 V in Planar Methylammonium Lead Iodide Perovskite Solar Cells," *ACS Energy Letters*, 4, 110-117 (2019).

Lucia, M. L., et al., "Capacitance measurements of p-n junctions: depletion layer and diffusion capacitance contributions," *Eur. J. Phys.* 14, 86-89 (1993).

Luo, Y., et al., "Direct Observation of Halide Migration and its Effect on the Photoluminescence of Methylammonium Lead Bromide Perovskite Single Crystals," Advanced Materials, 29, 1703451 (2017).

McGregor, Douglas S., "Materials for Gamma-Ray Spectrometers: Inorganic Scintillators," *Annual Review of Material Research* 48, 245-277 (2018).

Mery, Domingo, et al., "Automated X-ray object recognition using an efficient search algorithm in multiple views," 2013 IEEE Conference on Computer Vision and Pattern Recognition Workshops. (2013), pp. 368-374.

Mescher, H., et al., "Flexible Inkjet-Printed Triple Cation Perovskite X-ray Detectors," ACS Applied Materials & Interfaces 12, 15774-15784, (2020).

Nie, W., et al., "High-efficiency solution-processed perovskite solar cells with millimeter-scale grains," Science 347, 522-525 (2015).

Nie, Wanyi et al., "Critical Role of Interface and Crystallinity on the Performance and Photostability of Perovskite Solar Cell on Nickel Oxide," *Advanced Materials* 30, 1703879 (2018).

Owen, R. L., et al., "Determination of X-ray flux using silicon pin diodes," *J. Synchrotron Radiation* 16, 143-151 (2009).

Pan, W., et al., "Cs$_2$AgBiBr$_6$ single-crystal X-ray detectors with a low detection limit," *Nature Photonics* 11, 726-732 (2017).

Ramírez-Jiménez, F.J., "Pin Diode Detectors," *AIP Conference Proceedings* 1026, 213-226 (2008).

Shrestha, Shreetu, "High-performance direct conversion X-ray detectors based on sintered hybrid lead triiodide perovskite wafers," *Nature Photonics* 11, 436 (2017).

Shrestha, S., et al. "Role of the Metal-Semiconductor Interface in Halide Perovskite Devices for Radiation Photon Counting," ACS Applied Materials & Interfaces 12, 45533-45540 (2020).

Sinton, Ronald A., et al., "Contactless determination of current-voltage characteristics and minority-carrier lifetimes in semiconductors from quasi-steady-state photoconductance data," *Appl. Phys. Lett.* 69, 2510-2512 (1996).

Soe, Chan Myae Myae, et al., "New Type of 2D Perovskites with Alternating Cations in the Interlayer Space, (C(NH$_2$)$_3$)(CH$_3$NH$_3$)$_n$Pb$_n$I$_{3n+1}$: Structure, Properties, and Photovoltaic Performance," *Journal of the American Chemical Society* 139, 16297-16309 (2017).

Soe, C. M. M., et al., "Understanding Film Formation Morphology and Orientation in High Member 2D Ruddlesden-Popper Perovskites for High-Efficiency Solar Cells," *Advanced Energy Materials* 8(1), 1700979 (2018), 45 pages.

Stoumpos, C. C., et al., "Ruddlesden-Popper Hybrid Lead Iodide Perovskite 2D Homologous Semiconductors," *Chemisry of Materials* 28, 2852-2867 (2016).

Sun et al., "Rapid and Complete Conversion of CH3NH3PbI3 for Perovskite/C60 Planar-Heterojunction Solar Cells by Two-Step Deposition," *Chin. J. Chem.*, 35, pp. 687-692 (2017).

Tsai, H., et al., "A sensitive and robust thin-film x-ray detector using 2D layered perovskite diodes," Science Advances 6, eaay0815, (2020).

Tsai, Hsinhan et al., "Optimizing Composition and Morphology for Large-Grain Perovskite Solar Cells via Chemical Control," *Chemistry of Materials* 27, 5570-5576 (2015).

Tsai, H., et al., "High-efficiency two-dimensional Ruddlesden-Popper perovskite solar cells," *Nature* 536, 312-316 (2016).

Tsai, H., et al., "Stable Light-Emitting Diodes Using Phase-Pure Ruddlesden-Popper Layered Perovskites,". *Advanced Materials* 30(6), 1704217 (2018), 30 pages.

Tsai, Hsinhan, et al., "Light-induced lattice expansion leads to high-efficiency perovskite solar cells," *Science* 360, 67-70 (2018).

Tsai, H., et al., "Design principles for electronic charge transport in solution-processed vertically stacked 2D perovskite quantum wells," *Nature Communications* 9, 2130 (2018), 9 pages.

Walter, T., et al., "Determination of defect distributions from admittance measurements and application to Cu(In,Ga)Se$_2$ based heterojunctions," *J. Appl. Phys.* 80 (8), 4411-4420 (1996).

Wang, J., et al., Transient current analysis of a GaN radiation detector by TCAD, *Nuclear Instruments and Methods in Physics Research Section A: Accelerators, Spectrometers, Detectors and Associated Equpment* 761, 7-12 (2014).

(56) References Cited

OTHER PUBLICATIONS

Wei, H., et al., "Sensitive X-ray detectors made of methylammonium lead tribromide perovskite single crystals," *Nature Photonics* vol. 10, 333 (2016), 8 sheets.

Wei, W, et al., "Monolithic integration of hybrid perovskite single crystals with heterogenous substrate for highly sensitive X-ray imaging," *Nature Photonics* vol. 11, 315 (2017), 8 pages.

Wells, K., et al., "A Review of X-ray Explosives Detection Techniques for Checked Baggage," *Applied Radiation and Isotopes*, 70, No. 8, 1729-1746 (2012).

Xiao, Z., et al., "Giant switchable photovoltaic effect in organometal trihalide perovskite devices," Nature Materials 14, 193-198 (2015).

Xu, X., et al., "Halide perovskites: a dark horse for direct X-ray imaging," EcoMat 2, e12064, (2020).

Xu, Y., et al., "Crystallization Kinetics in 2D Perovskite Solar Cells," Advanced Energy Materials 10, 2002558 (2020).

Yaffe, M. J., et al., "X-ray detectors for digital radiography," *Phys. Med. Biol.* 42, 1-39 (1997).

Yagi, N., et al., "CMOS Imaging Detectors as X-ray Detectors for Synchrotron Radiation Experiments," *AIP Conf. Proc.* 705, 885-888 (2004).

Yakunin, S., et al., "Detection of X-ray photons by solution-processed organic-inorganic perovskites," *Nat. Photonics* 9, 444 (2015).

\* cited by examiner

SENSITIVE AND ROBUST THIN FILM X-RAY DETECTOR USING 2D LAYERED PEROVSKITE DIODES

CROSS-REFERENCE TO RELATED APPLICATION(S)

This application claims priority to and the benefit of U.S. Provisional Patent Application No. 63/085,089, titled "SENSITIVE AND ROBUST THIN FILM X-RAY DETECTOR USING 2D LAYERED PEROVSKITE DIODES," filed in the United States Patent and Trademark Office on Sep. 29, 2020, the entire content of which is incorporated herein by reference.

STATEMENT REGARDING FEDERALLY SPONSORED RESEARCH OR DEVELOPMENT

The United States government has rights in this invention pursuant to Contract No. 89233218CNA000001 between the United States Department of Energy/National Nuclear Security Administration and Triad National Security, LLC for the operation of Los Alamos National Laboratory.

BACKGROUND

Solid-state radiation detectors directly convert X-ray signals into electrical current with good sensitivity and high-count rate that typically outperform other detection technologies. Such detector technologies with high detectivity and sensitivity are critically needed in medical and security applications, as well as in advanced photon source facilities. See A. R. Cowen, S. M. Kengyelics, A. G. Davies, Solid-state, flat-panel, digital radiography detectors and their physical imaging characteristics. *Clin. Radiol.* 63, 487-498 (2008): M. Hoheisel, Review of medical imaging with emphasis on X-ray detectors. *Nucl. Instrum. Methods. Phys. Res. A* 563, 215-224 (2006); M. J. Yaffe, J. A. Rowlands, X-ray detectors for digital radiography. *Phys. Med. Biol.* 42, 1-39 (1997); B. G. Durie, S. E. Salmon, High speed scintillation autoradiography. *Science* 190, 1093 (1975); J. Irvine, M. Young, S. German, R. Eaton, in 2015 *IEEE Applied Imagery Pattern Recognition Workshop (AIPR)*. (2015), pp. 1-9; D. Mery, V. Riffo, I. Zuccar, C. Pieringer, in 2013 IEEE Conference on Computer Vision and Pattern Recognition Workshops. (2013), pp. 368-374; K. Wells, D. A. Bradley, A review of X-ray explosives detection techniques for checked baggage. *Appl. Radiat. Isot.* 70, 1729-1746 (2012); T. Hatsui, H. Graafsma, X-ray imaging detectors for synchrotron and XFEL sources. *IUCrJ* 2, 371-383 (2015); A. Bergamaschi, S. Cartier, R. Dinapoli, D. Greiffenberg, I. Johnson, D. Mezza, A. Mozzanica, B. Schmitt, X. Shi, J. Jungmann-Smith, G. Tinti, X-ray Detector Development at the Swiss Light Source. *Synchrotron Radiat. New.* 27, 3-8 (2014); and N. Yagi, M. Yamamoto, K. Uesugi, K. Inoue, CMOS Imaging Detectors as X-ray Detectors for Synchrotron Radiation Experiments. *AIP Conf. Proc.* 705, 885-888 (2004), the entire contents of all of which are incorporated herein by reference.

In a high-performance X-ray detector, one important requirement is to minimize the dark current amplitude at reverse bias so that current generated at low X-ray dosage can be well resolved above the dark noise, which determines the device's detectivity (i.e., the lowest detectable dosage). This generally requires: a) high purity semiconductors to suppress thermally activated recombination in dark via trap states; and b) fully depleted junctions across the active regions to avoid space charge accumulation and interfacial charge recombination. Furthermore, the semiconducting materials used for the detector should be robust, without current drifting or current-voltage hysteresis. Currently, the approach is to use high purity semiconducting single crystals operating under high voltages across the active region to efficiently collect generated charges and avoid recombination losses. See D. S. McGregor, Materials for Gamma-Ray Spectrometers: Inorganic Scintillators. *Annu. Rev. Mater. Res.* 48, 245-277 (2018); and F. J. Ramirez-Jimenez, PIN Diode Detectors. *AIP Conf. Proc.* 1026, 213-226 (2008), the entire contents of all of which are incorporated herein by reference. However, such a detector needs a high operational voltage across a large thickness (~1 cm), leading to issues like charge drifting under or high fabrication costs for obtaining large volumes of mono-crystals. This undermines use of such detectors in scalable imaging applications.

SUMMARY

According to embodiments of the present disclosure, a radiation detector includes a p-i-n diode that includes a p-type contact layer, an n-type contact layer, and an intrinsic layer between the p-type contact layer and the n-type contact layer. The intrinsic layer includes a thin film including a highly crystalline 2D layered perovskite material. In some embodiments, the radiation detector further includes a conducting substrate and a top electrode. In some embodiments, the p-type contact layer is on the conducting substrate, and the top electrode is on the n-type contact layer. And in some embodiments, the top electrode is gold. In some embodiments, the thin film of the intrinsic layer has a thickness in the range of 0.1 µm-100 µm.

In some embodiments, the radiation detector generates an open circuit voltage (VOC) of about 400 mV to about 800 mV under X-ray exposure. And the radiation detector has a detecting photon density limit on the order of 108 Ct $s^{-1}cm^{-2}$. In some embodiments, the radiation detector may also have a volume sensitivity of 0.1 C $Gy_{air}^{-1}cm^{-3}$ to about 0.9 C $Gy_{air}^{-1}cm^{-3}$. And in some embodiments, the radiation detector may have a sensitivity of 100 µC $Gy_{air}^{-1}cm^{-2}$ to about 5,000 µC $Gy_{air}^{-1}cm^{-2}$.

In some embodiments, the radiation detector may be self-powered. And in some embodiments, the radiation detector may be capable of operation without the application of bias. In some embodiments, when under pulsed laser, the radiation detector has a rise time of less than 500 ns and a fall time in the range of 20-60-microseconds.

According to some embodiments, the highly crystalline 2D layered perovskite material may comprise a perovskite represented by Formula 1A:

$A_2B_{n-1}M_nX_{3n+1}$      Formula 1A

In Formula 1A, A is a first organic or inorganic cation, B is a second organic or inorganic cation, M is a metal, X is an anion, and n is an integer greater than or equal to 1. In some embodiments, A may include an inorganic cation comprising an alkali metal, an alkaline earth metal, and/or a lanthanide metal. For example, in some embodiments, A may be a primary, secondary, or tertiary aliphatic alkylammonium cation or a primary, secondary, or tertiary aromatic alkylammonium cation. In some embodiments, M may be a main group metal. And in some embodiments, B may be a primary, secondary, or tertiary aliphatic alkylammonium cation or a primary, secondary, or tertiary aromatic alkylammonium cation.

In some embodiments, the highly crystalline 2D layered perovskite material may include a perovskite represented by Formula 2A:

$$(BA)_2(MA)_{n-1}(Pb)_n(I)_{3n+1}. \quad \text{Formula 2A}$$

In Formula 2A, n is an integer greater than or equal to 1, BA is an n-butyl ammonium cation, and MA is a methyl ammonium cation. In some embodiments, the highly crystalline 2D layered perovskite material includes a perovskite selected from $(BA)_2(MA)_2Pb_3I_{10}$, $(BA)_2(MA)_3Pb_4I_{13}$, and $(BA)_2(MA)_4Pb_5I_{16}$.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and other features and advantages of the present disclosure will be better understood with reference to the detailed description when considered in conjunction with the accompanying drawings, in which.

DETAILED DESCRIPTION

Direct conversion X-ray imaging technology delivers excellent sensitivity by directly converting X-ray photon to electrical signals, which is in wide demand for medical imaging, security screening, crystallography, etc. Lead halide perovskite single crystals are being developed for low-cost direct conversion X-ray sensing with record breaking detection sensitivities. Additionally, polycrystalline perovskite-film-based detectors are predominantly attractive to assemble imagers by printing methods, which can also be built flexible, allowing for sensing from multiple directions. However, the main challenge is depositing thick layers without voids or traps to maintain the high performance. According to embodiments of the present disclosure, high quality 2D perovskite, highly crystalline layers for used in a p-i-n architecture for X-ray imaging. Hot-casting the 2D perovskite layers enables deposition of compact and highly crystalline layers with excellent uniformity on both rigid and flexible substrates. Photodiodes built with the 2D layers exhibit low dark current and stable operation under constant electrical field over 96 hours in dark, and over 15 hours under X-ray irradiation. The detectors yield very high sensitivity, and have a sensitivity gain when operated under higher fields, and high resolution images can be obtained using a pixel size of 20 μm by 15 μm.

Figure 1A:
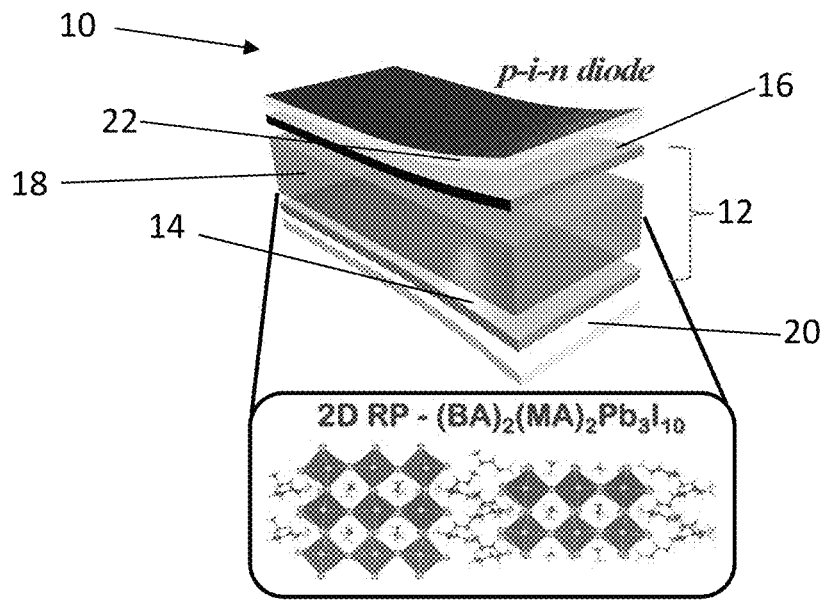
FIG. 1A is a schematic illustration of the 2D Ruddlesden-Popper (RP) phase-based p-i-n thin film X-ray detector device architecture including $(BA)_2(MA)_2Pb_3I_{10}$ (dubbed "Pb3") as an absorbing layer according to embodiments of the present disclosure.
Figure 13A:
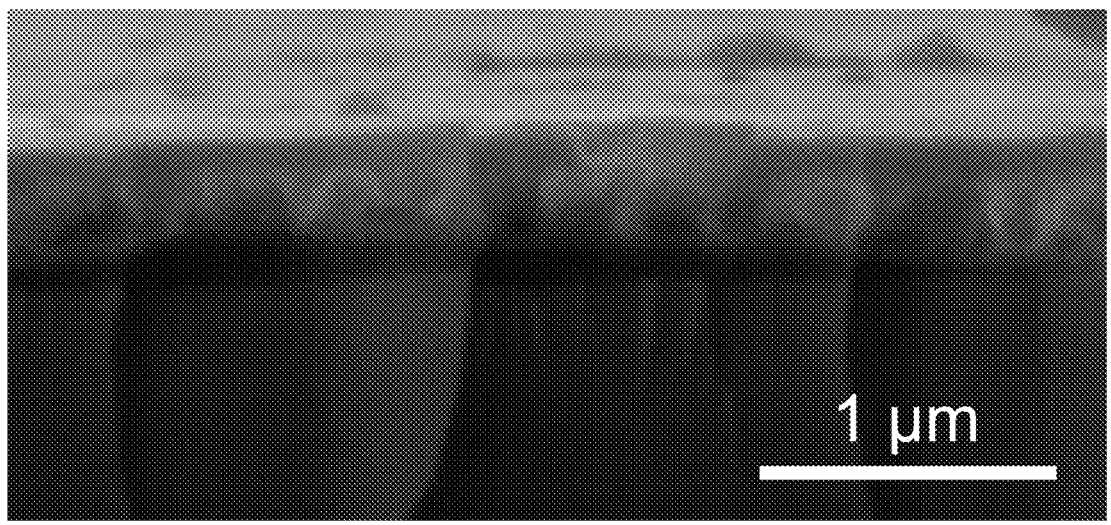
FIG. 13A is a Scanning Electron Micrograph (SEM) of a cross-section of a Pb3 thin film with a thickness of 470 nm according to embodiments of the present disclosure.
Figure 13B:
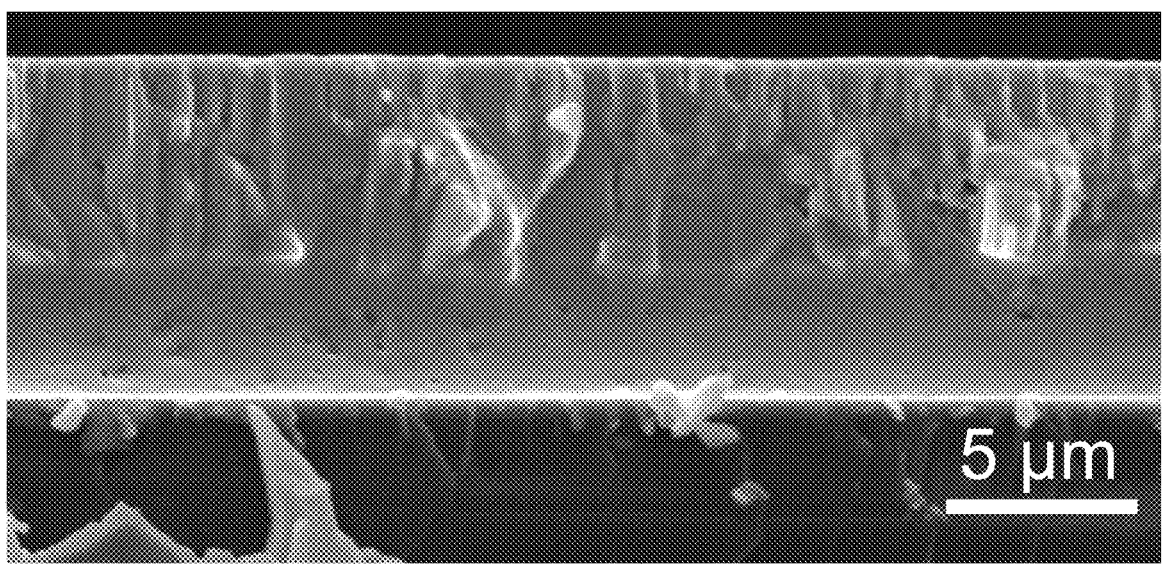
FIG. 13B is a SEM of a cross-section of a PB3 thin film with a thickness of 8 μm according to embodiments of the present disclosure.
Figure 13C:
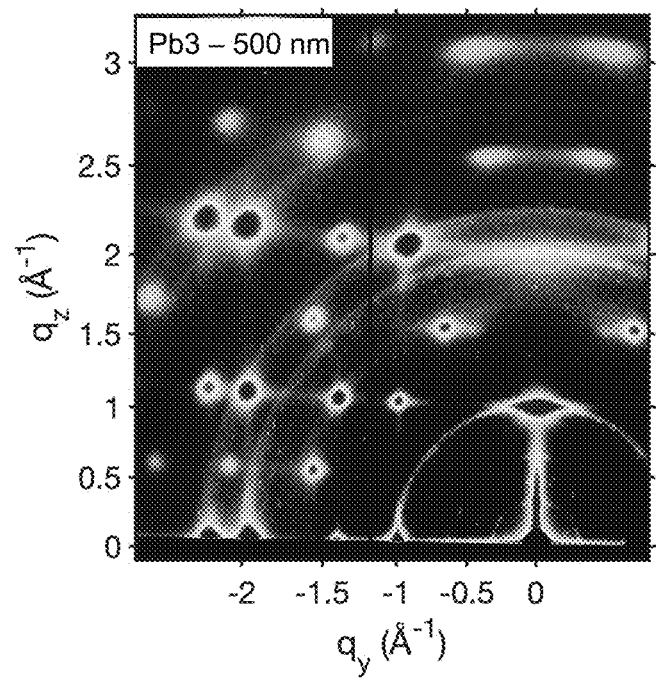
FIG. 13C is a synchrotron GIWAXS map of a PB3 thin film with a thickness of 500 nm according to embodiments of the present disclosure.
Figure 13D:
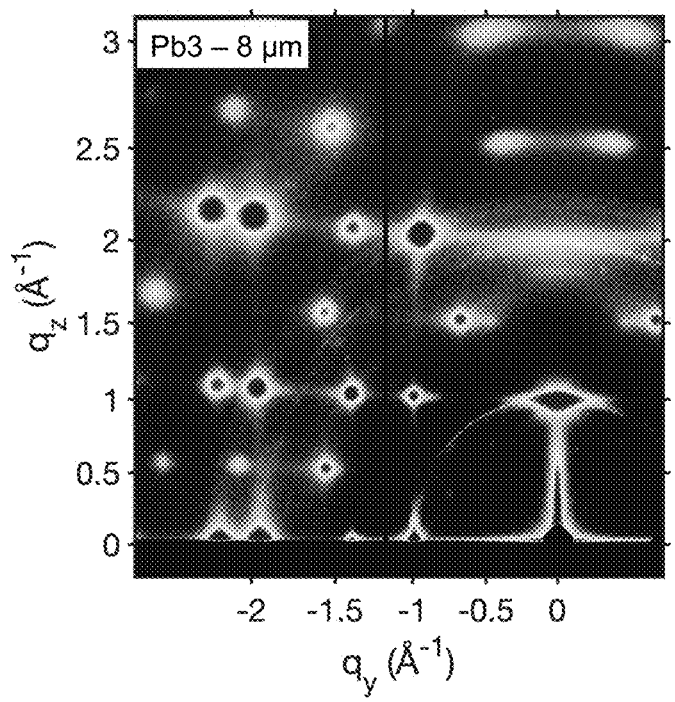
FIG. 13D is a synchrotron GIWAXS map of a PB3 thin film with a thickness of 8 μm according to embodiments of the present disclosure.
Figure 14:
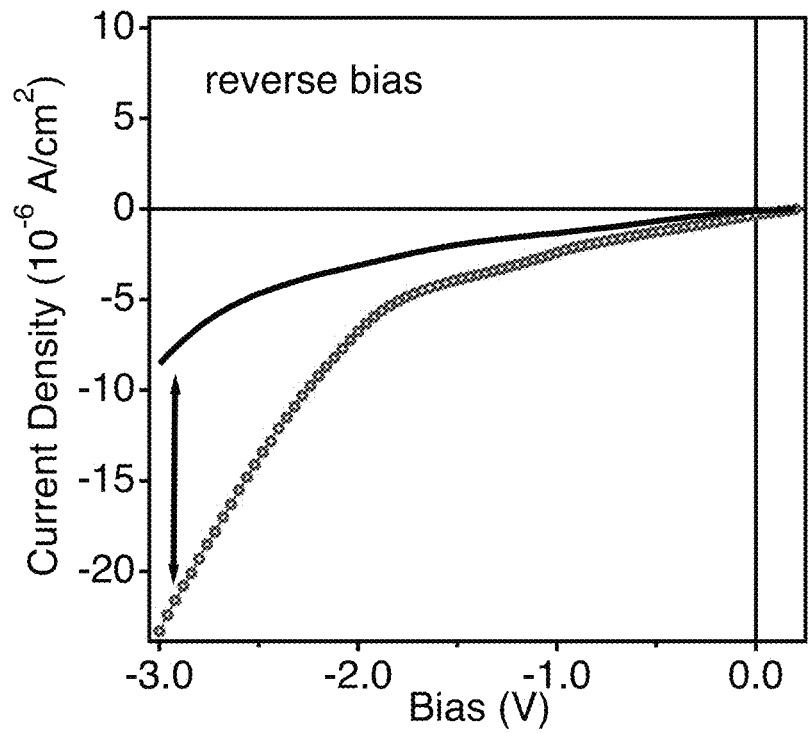
FIG. 14 is a graph depicting current-voltage characteristics of a thick device in dark and under X-ray exposure according to embodiments of the present disclosure.

According to embodiments of the present disclosure, as shown generally in FIG. 1A, a radiation detector (e.g., an X-ray detector) device 10 includes a p-i-n diode structure 12. The p-i-n diode structure 12 may include a p-type contact layer 14, an n-type contact layer 16, and an intrinsic layer 18 between the p-type contact layer 14 and the n-type contact layer 16. And the intrinsic layer 18 may be a thin film including a highly crystalline 2D layered perovskite material. As used herein, the term "highly crystalline" is used to denote the crystalline structure and morphology of the thin film, and would be understood by those of ordinary skill in the art. For example, in some embodiments, the term "highly crystalline" may denote a thin film having a crystalline grain size of about 10 microns or greater. And in some example embodiments, "highly crystalline" thin films may have an X-ray scattering pattern similar to that shown in FIG. 1B, and a morphology similar to that shown in FIG. 13B.

In some embodiments, the p-i-n diode structure 12 may be sandwiched between a conducting substrate 20 and a conductive electrode 22. According to some embodiments, the p-i-n diode structure 12 may be arranged between the conducting substrate 20 and the conductive electrode 22 such that the p-type contact layer 14 is closest to (or on) the conducting substrate and the n-type contact layer 16 is closest to (or on) the conductive electrode.

In the radiation detectors according to embodiments of the present disclosure, the p-type contact layer, n-type contact layer, conducting substrate and conductive electrode are not particularly limited, and may include any suitable materials known for these components. Indeed, the n-type contact layer may include any suitable n-type semiconductor material. Likewise, the p-type contact layer may include any suitable p-type semiconductor material. As both p-type and n-type semiconductors, and indeed, p-type and n-type contact layers in p-i-n diode architectures are known in this field, those of ordinary skill in the art would be capable of selecting appropriate p-type and n-type semiconductors, and constructing appropriate p-type and n-type contact layers for the p-i-n structure. However, some non-limiting examples of suitable p-type contact layers include 3,4-ethylenedioxythiophene)poly(styrenesulfonate) (PEDOT:PSS); poly(3-hexylthiophene-2,5-diyl) (P3HT); oligothiophene; 2,2',7,7'-Tetrakis-(N,N-di-4-methoxyphenylamino)-9,9'-spirobifluorene; nickel oxide (Spiro-oMeTAD); vanadium (V) oxide ($V_2O_5$); tungsten trioxide ($WO_3$); molybdenum trioxide ($MoO_3$); copper(I) thiocyanate; poly[N,N'-bis(4-butylphenyl)-N,N'-bis(phenyl)-benzidine] (polyTPD); N,N'-Bis(3-methylphenyl)-N,N'-diphenylbenzidine (TPD). And some non-limiting examples of suitable n-type contact layers include [6,6]-phenyl-$C_{60}$ butyric acid methyl ester (PCBM); fullerene or other fullerene derivatives including but not limited to C60, PC60BM, C70 or PC70BM; zinc oxide; titanium oxide; and Bathocuproine. Some additional non-limiting examples of suitable p-type and n-type semiconductors and contact layers can be found in Sun et al., "Rapid and Complete Conversion of CH3NH3PbI3 for Perovskite/C60 Planar-Heterojunction Solar Cells by Two-Step Deposition," *Chin. J. Chem.*, 35, pgs. 687-692 (2017); and Liu et al., "Open-Circuit Voltages Exceeding 1.26 V in Planar Methylammonium Lead Iodide Perovskite Solar Cells," *ACS Energy Lett.*, 4, 110-117 (2019), the entire contents of all of which are incorporated herein by reference.

Similarly, the conducting substrate and conductive electrode may include any suitable materials for such components. Those of ordinary skill in the art would be capable of selecting appropriate materials for the conducting substrate and the conductive electrode. However, some nonlimiting examples of suitable conducting substrates include transparent conductive oxides, such as (but not limited to) indium tin oxide (ITO), aluminum doped zinc oxide (AZO) and fluorine doped tin oxide (FTO). In some embodiments, for example, the conducting substrate may include a nonconductive substrate support (e.g., glass) coated with a transparent conductive oxide (e.g., ITO). In some embodiments, for example, the substrate may be a rigid substrate (e.g., such as glass) or a flexible substrate (e.g., such as a polymeric (e.g., polyimide) substrate (e.g., but not limited to Kapton® (DuPont), which may be coated with a transparent conductive oxide. Additionally, some nonlimiting examples of suitable conductive electrodes include metal electrodes, such as (but not limited to) gold (Au), aluminum (Al), silver (Ag), or platinum (Pt). And in some embodiments, the conductive electrode may be gold (Au). In some embodiments, for example, the conductive electrode may include a nonconductive substrate support (e.g., glass) coated with a metal electrode (e.g., Au, Al, Ag or Pt). In some embodiments, for example, the substrate may be a rigid substrate (e.g., such as glass) or a flexible substrate (e.g., such as a polymeric (e.g., polyimide) substrate (e.g., but not limited to Kapton® (DuPont), which may be coated with a metal electrode.

In some embodiments, the 2D perovskite material may be a Ruddlesden-Popper (RP) phase perovskite. Suitable 2D RP phase perovskite materials, and methods of making them and their thin films are described in detail in U.S. patent application Ser. No. 15/641,142, filed on Jul. 3, 2017, titled "HIGH-EFFICIENCY AND DURABLE OPTOELECTRONIC DEVICES USING LAYERED 2D PEROVSKITES," and naming Triad National Security, LLC as the Applicant, the entire content of which is incorporated herein by reference. For example, and as discussed in U.S. patent application Ser. No. 15/641,142, the layered 2D perovskite material may be represented by Formula 1A:

$$A_2B_{n-1}M_nX_{3n+1}. \quad \text{Formula 1A}$$

In Formula 1A, A is a first organic or inorganic cation, B is a second organic or inorganic cation, M is a metal (e.g., a metal cation), X is an anion, and n is an integer greater than or equal to 1.

In some embodiments, the first organic or inorganic cation A may be included in the cationic regions (layers) and may act as a spacer between perovskite regions (layers). Furthermore, the cation A may be a sterically bulky cation to confine perovskite growth to two dimensions. However, any suitable cation may be used as A.

The term "sterically bulky" is used in its art-recognized sense to refer to a molecule, group, or cation having an effective volume (as determined by the space taken up by its constituent atoms) that excludes the presence of other molecules or groups in the same unit cell, plane, radius, etc. due to repulsion between the electron clouds of the molecules or groups.

In some embodiments, A may be an inorganic cation including an alkali metal (e.g., Na, K, Rb, and Cs), an alkaline earth metal (e.g., Mg, Ca, Sr, and Ba), and/or a lanthanide metal (e.g. La, Nd, Sm, Eu, Gd, Dy).

In some embodiments, A may be an organic cation, such that the layered 2D perovskite material represented by Formula 1A is an organic-inorganic hybrid. For example, A may be an organic cation including a Group V non-metal such as nitrogen (N) and/or phosphorus (P) bonded to one or more carbon-containing groups.

In some embodiments, A may be an organic cation including a N atom that is protonated, alkylated, or arylated with a suitable number of substituents so that it bears a positive formal charge. The substituents of the N atom are not particularly limited, and may be selected from alkyl groups, aryl groups, heteroalkyl groups, and heteroaryl groups. In some embodiments, the substituents may be coupled or bonded to the N atom via a single bond or a double bond. In some embodiments, two or more substituents may be coupled or bonded to each other to form a ring.

In some embodiments, A may be a primary, secondary, or tertiary aliphatic alkylammonium cation or a primary, secondary, or tertiary aromatic alkylammonium cation. In some embodiments, A may be a primary alkylammonium cation represented by the general formula $H_3NR_1^+$. When A is a primary aliphatic alkylammonium cation, the $R_1$ group of the cation may be an alkyl group, for example, a methyl group, an ethyl group, a propyl group, an isopropyl group, an n-butyl group, a t-butyl group, etc. When A is a primary aromatic alkylammonium cation, the $R_1$ group of the cation may be an aryl group, for example, a phenyl group, a naphthyl group, a biphenyl group, etc. In some embodiments, A may be a primary aliphatic alkylammonium cation including an n-butyl group, such that A is an n-butyl ammonium cation.

In some embodiments, the second organic or inorganic cation B in Formula 1A may be included in the perovskite regions (layers). The second organic or inorganic cation B may be intercalated between adjacent metal-anion ($MX_6$) octahedra. In some embodiments, the second organic or inorganic cation B may be an inorganic cation including an alkali metal (e.g., Na, K, Rb, and Cs), an alkaline earth metal (e.g., Mg, Ca, Sr, and Ba), or a lanthanide metal (e.g. La, Nd, Sm, Eu, Gd, Dy).

In some embodiments, B may be an organic cation containing a Group V non-metal such as N and/or P. In some embodiments, B may be an organic cation including a N atom that is protonated, alkylated, or arylated with a suitable number of substituents so that it bears a positive formal charge. The substituents of the N atom are not particularly limited, and may be selected from alkyl groups, aryl groups, heteroalkyl groups, and heteroaryl groups. In some embodiments, the substituents may be coupled or bonded to the N atom via a single bond or a double bond. In some embodiments, two or more substituents may be coupled or bonded to each other to form a ring.

For example, B may be an amidinium cation such as formamidinium.

In some embodiments, B may be a primary, secondary, or tertiary aliphatic alkylammonium cation or a primary, secondary, or tertiary aromatic alkylammonium cation. In some embodiments, B may be a primary alkylammonium cation represented by the general formula $H_3NR_2^+$. In some embodiments, when B is a primary aliphatic alkylammonium cation, the $R_2$ group of the cation may be an alkyl group, for example, a methyl group, an ethyl group, a propyl group, an isopropyl group, an n-butyl group, a t-butyl group, etc. In some embodiments, when B is a primary aromatic alkylammonium cation, the $R_2$ group of the cation may be an aryl group, for example, a phenyl group, a naphthyl group, a biphenyl group, etc. In some embodiments, B may be a primary aliphatic alkylammonium cation including a methyl group, such that B is a methyl ammonium cation.

In some embodiments, the metal M in Formula 1A may be included in the perovskite regions (layers) and may be positioned in the centers of perovskite octahedra. In some embodiments, the metal M may be a transition metal or a main group metal, non-limiting examples of which may include first-row transition metals (e.g., Sc, Ti, V, Cr, Mn, Fe, Co, Ni, Cu, and/or Zn), second-row transition metals (e.g., Y, Zr, Nb, Mo, Tc, Ru, Rh, Pd, Ag, and/or Cd), third-row transition metals (e.g., Hf, Ta, W, Ru, Os, Ir, Pt, Au, and/or Hg), and main group metals (e.g., Al, Ga, In, Sn, Tl, Pb, B, and/or Po). In some embodiments, M may be Sn and/or Pb.

In some embodiments, the anion X in Formula 1A may be included in the perovskite regions (layers) and may be positioned at the corners of the perovskite octahedra. In some embodiments, the anion X may be a halide anion (e.g., Cl, Br, and/or I) and/or a chalcogenide anion (e.g., 0 and/or S). In some embodiments, X may be iodide.

In some embodiments, in Formula 1A, M may be Pb and X may be I, such that the thin film includes one or more lead-iodide inorganic perovskite layers.

In some embodiments, in the layered 2D perovskite represented by Formula 1A, A is n-butyl ammonium (BA), B is methyl ammonium (MA), M is Pb, and X is iodide (I), such that the thin film includes a layered 2D perovskite of the $(BA)_2(MA)_{n-1}Pb_nI_{3n+1}$ perovskite family. Here, $\{(MA)_{n-1}Pb_nI_{3n+1}\}^{2-}$ denotes the anionic inorganic layer derived from the parent 3D perovskite, methylammonium lead triiodide ($MAPbI_3$).

In Formula 1A, n is an integer greater than or equal to 1 and refers to the number of contiguously stacked perovskite octahedra in the inorganic perovskite layers, as discussed in more detail in U.S. patent application Ser. No. 15/641,142, which has already been incorporated herein by reference in its entirety. As further discussed in U.S. patent application Ser. No. 15/641,142, n may be selected to tune the desired properties of the 2D layered perovskite material. In some embodiments, however, n may be an integer selected from 1 to 20. In some embodiments, n may be an integer selected from 1 to 15, 2 to 10, 2 to 7, or 2 to 5, and in some embodiments, n may be an integer selected from 3 to 5.

Indeed, in some embodiments, for example, the 2D RP phase perovskite material may be represented by Formula 2A.

$$(BA)_2(MA)_{n-1}(Pb)_n(I)_{3n+1} \quad \text{Formula 2A}$$

In Formula 2A, n is as discussed above in connection with Formula 1A, BA is an n-butyl ammonium cation, and MA is a methyl ammonium cation. Some non-limiting examples of suitable 2D RP phase perovskite materials for the thin film intrinsic layer in the p-i-n structure include $(BA)_2(MA)_2Pb_3I_{10}$ (also referred to herein, interchangeably, as "Pb3"), $(BA)_2(MA)_3Pb_4I_{13}$, and $(BA)_2(MA)_4Pb_5I_{16}$.

The layered 2D perovskites may be synthesized using any suitable starting material and/or process. For example, the ammonium cations used as A and B in Formula 1A may be synthesized by acidifying the respective amines with hydroiodic acid (HI) to produce ammonium iodide salts. In some embodiments, when A is an n-butyl ammonium cation and B is a methyl ammonium cation, A and B may be produced by acidifying aqueous solutions of n-butyl amine and methylamine. An example synthetic procedure is described in Cao, D. H. et al., "2D Homologous Perovskites as Light-Absorbing Materials for Solar Cell Applications", *Journal of the American Chemical Society* 2015, 137 (24), 7843-7850, the entire content of which is incorporated herein by reference.

For example, in some embodiments, a solution of the perovskites may be prepared by mixing halide (e.g., iodide) salts of the A, B and M components of the perovskite formula in amounts dictated by the stoichiometry of the desired perovskite. For example, to make a solution of perovskites according to Formula 2A, the mixture may contain BAI, MAI and Pb in an appropriate stoichiometric ratio. The powders of the halide (e.g., iodide) salts may be dissolved in an appropriate solvent (e.g., DMF or the like), and the solution may be heated to aid dissolution in the solvent. The temperature of this heating is not particularly limited, and may be any temperature suitable to effect complete (or generally complete) dissolution of the powders. The temperature of this heating may also depend on the chemistry of the perovskite being synthesized, and those of ordinary skill in the art would be capable of selecting an appropriate temperature. However, as an illustrative, and nonlimiting example only, the temperature of this heating may be about 100° C. to about 150° C., about 100° C. to about 130° C., or about 110° C.

After dissolution of the powders in the solvent, the dissolved solution may also be heated prior to deposition or printing onto a substrate to form the thin film. The temperature of this pre-deposition heating may depend on the temperature of the substrate during the deposition process. However, in some embodiments (for example, when synthesizing the perovskites satisfying Formula 2A), the solution may be pre-heated to about 100° C. to about 150° C., for example, about 150° C.

A thin film of the perovskites, suitable for radiation detectors according to embodiments of the present disclosure, may be formed using any suitable technique to print or deposit the solution on a substrate, including spin coating, spray coating, ink-jet printing, dip-coated, etc. In some embodiments, however, the thin film for an optoelectronic device may be formed at an elevated temperature or under heating conditions, such as those associated with a hot-casting process. In some embodiments, for example, the layered 2D perovskite thin films may be made according to the hot-casting process disclosed in U.S. patent application Ser. No. 15/641,142, which has already been incorporated herein by reference in its entirety. The hot-casting process rapidly drives away solvent during film formation, helping to increase (or scale-up) the layer thickness, enabling printing or deposition of thicker 2D perovskite layers. Indeed, high-quality, thick perovskite layers can be hard to achieve by conventional coating methods at room temperature. For example, the film crystallization starts from the precursor-air interface where the solvent first escapes, thus creating solvent trapping underneath the surface. Furthermore, film uniformity and crystallinity can be hard to control using conventional coating methods when the layer grows thicker. The hot-casting method circumvents these issues by rapidly driving away the solvent during the film formation process, which helps to scale up the layer thickness. As a result, the hot-casting method can ensure complete solvent removal. Also, casting at higher temperatures increases the layer thickness up to about 10 μm (or greater), whereas room temperature casting typically yields much thinner thicknesses.

In the hot-casting process, the substrate on which the layered 2D perovskites are deposited may be heated prior to deposition. The temperature of this substrate heating is not particularly limited so long as the substrate is hot enough to rapidly drive away the solvent during the film formation process, and sufficient to achieve the desired layer thickness. In some embodiments, for example, the substrate may be heated to a temperature of about 120° C. to about 190° C., about 120° C. to about 180° C., about 140° C. to about 180° C., about 150° C. to about 170° C., about 150° C. to about 160° C., or about 160° C.

The thickness of the perovskite layer is not particularly limited, so long as it is suitable for use in radiation (or X-ray) detection applications. However, one benefit of the hot-casting process and the 2D perovskite chemistry of the intrinsic layers according to embodiments of the present disclosure is the ability to make high quality, thick perovskite thin films suitable for robust, sensitive radiation (or X-ray) detector applications. In some embodiments, for example, the perovskite thin film may have thickness of 100 microns or less. For example, in some embodiments, the perovskite thin film may have a thickness of about 0.1 microns to about 100 microns, about 0.4 microns to about 100 microns, about 0.5 microns to about 100 microns, about 0.1 microns to about 15 microns, 0.4 microns to about 15 microns, about 0.5 microns to about 15 microns, about 0.1 microns to about 10 microns, about 0.4 microns to about 10 microns, or about 0.5 microns to about 10 microns.

According to embodiments of the present disclosure, the p-i-n architecture using highly crystalline 2D perovskite thin film intrinsic layers enables radiation detectors having high open circuit voltage (Voc) under X-ray exposure, good detecting photon density limits, and excellent sensitivity. The radiation detectors using the highly crystalline 2D perovskite thin films may also be self-powered, and capable of operation without the application of bias.

For example, in some embodiments, the radiation detector may generate an open circuit voltage (Voc) of about 400 to 800 mV under X-ray exposure. In some embodiments, for example, the radiation detector may generate an open circuit voltage (Voc) of about 450 mV to about 750 mV, about 500 mV to about 700 mV, about 550 mV to about 700 mV, or about 650 mV under X-ray exposure.

According to some embodiments, the radiation detectors may have a detecting photon density limit on the order of $10^8$ Ct s$^{-1}$cm$^{-2}$. For example, in some embodiments, the radiation detectors may have a detecting photon density limit of about $1 \times 10^8$ Ct s$^{-1}$cm$^{-2}$ to about $9 \times 10^8$ Ct s$^{-1}$ cm$^{-2}$, about $1 \times 10^8$ Ct s$^{-1}$ cm$^{-2}$ to about $8 \times 10^8$ Ct s$^{-1}$ cm$^{-2}$, about $1 \times 10^8$ Ct s$^{-1}$ cm$^{-2}$ to about $6 \times 10^8$ Ct s$^{-1}$ cm$^{-2}$, about $3 \times 10^8$ Ct s$^{-1}$ cm$^{-2}$ to about $8 \times 10^8$ Ct s$^{-1}$ cm$^{-2}$, about $3 \times 10^8$ Ct s$^{-1}$ cm$^{-2}$ to about $6 \times 10^8$ Ct s$^{-1}$ cm$^{-2}$, or about $5 \times 10^8$ Ct s$^{-1}$ cm$^{-2}$.

In some embodiments, the radiation detectors may have high sensitivity. For example, in some embodiments, the radiation detectors may have a sensitivity of about 0.1 C Gy$_{air}^{-1}$cm$^{-3}$ to about 0.9 C Gy$_{air}^{-1}$cm$^{-3}$, for example, about 0.1 C Gy$_{air}^{-1}$cm$^{-3}$ to about 0.7 C Gy$_{air}^{-1}$cm$^{-3}$, about 0.1 C Gy$_{air}^{-1}$cm$^{-3}$ to about 0.5 C Gy$_{air}^{-1}$cm$^{-3}$, or about 0.3 C Gy$_{air}^{-1}$cm$^{-3}$.

In some embodiments, the radiation detectors have good dark resistivity. For example, in some embodiments, the radiation detectors have dark resistivity on the order of $10^{13}$ 0 cm or lower, for example $10^9$ 0 cm to $10^{13}$ 0 cm, $10^9$ 0 cm to $10^{12}$ 0 cm, $10^{10}$ 0 cm to $10^{12}$ 0 cm or $10^{11}$ 0 cm or $10^{12}$ 0 cm.

According to some embodiments, when under pulsed laser, the radiation detector may have a rise time of less than 500 ns, and a fall time of about 10 microseconds to about 100 microseconds. For example, in some embodiments, when under pulsed laser, the radiation detector may have a rise time of less than 500 ns, and a fall time of about 20 to about 60 microseconds.

Examples

The following examples, materials and methods, and characterization schemes are presented for illustrative purposes only, and do not limit the scope or content of this disclosure.

$(BA)_2(MA)_2Pb_3I_{10}$ Devices

Materials and Instruments

Lead oxide (PbO), methylamine hydrochloride (MACl), hydriodic acid (HI, 57 wt % in H$_2$O), hypophosphorous acid (H3PO$_2$, 50% in H$_2$O), butylamine (BA, 99%), C$_{60}$-Fullerene, poly[bis(4-phenyl)(2,4,6-trimethylphenyl)amine (PTAA) and N,N-dimethylformamide (DMF, anhydrous) were purchased from Sigma-Aldrich and used without further purification. Tektronix Keithley 2400 SMU was used for data collection. The silicon reference device was purchased from Thorlab Si photo-diodes (FDS 1010).

2D RP Material Preparation

Raw 2D layered perovskite materials were prepared by combining PbO, MACl and BA in appropriate ratios in a HI/H$_3$PO$_2$ solvent mixture as described followed by previous reports in C. M. M. Soe, C. C. Stoumpos, M. Kepenekian, B. Traoré, H. Tsai, W. Nie, B. Wang, C. Katan, R. Seshadri, A. D. Mohite, J. Even, T. J. Marks, M. G. Kanatzidis, New Type of 2D Perovskites with Alternating Cations in the Interlayer Space, (C(NH2)3)(CH3NH3) nPbnI3n+1: Structure, Properties, and Photovoltaic Performance. *J. Am. Chem. Soc.* 139, 16297-16309 (2017); C. C.

Stoumpos, D. H. Cao, D. J. Clark, J. Young, J. M. Rondinelli, J. I. Jang, J. T. Hupp, M. G. Kanatzidis, Ruddlesden-Popper Hybrid Lead Iodide Perovskite 2D Homologous Semiconductors. Chem. Mater. 28, 2852-2867 (2016); and D. H. Cao, C. C. Stoumpos, O. K. Farha, J. T. Hupp, M. G. Kanatzidis, 2D Homologous Perovskites as Light-Absorbing Materials for Solar Cell Applications. *J. Am. Chem. Soc.* 137, 7843-7850 (2015), the entire contents of all of which are incorporated herein by reference. The materials were characterized with XRD for purity and desired n number.

Detector Fabrication $(BA)_2(MA)_2Pb_3I_{10}$ solutions were prepared with molar concentrations of 2 M, 1 M, 0.5 M and 0.25 M of $Pb^{2+}$ cations in anhydrous DMF. ITO glasses were cleaned using an ultra-sonication bath in soap water and rinsed progressively with distilled water, acetone and isopropyl alcohol, and finally treated with oxygen plasma for 5 min, and then transferred to an argon-filled glovebox. Further details of these processes can be found in C. M. M. Soe, W. Nie, C. C. Stoumpos, H. Tsai, J.-C. Blancon, F. Liu, J. Even, T. J. Marks, A. D. Mohite, M. G. Kanatzidis, Understanding Film Formation Morphology and Orientation in High Member 2D Ruddlesden-Popper Perovskites for High-Efficiency Solar Cells. *Adv. Energy Mater.* 8, 1700979 (2018); and H. Tsai, W. Nie, P. Cheruku, N. H. Mack, P. Xu, G. Gupta, A. D. Mohite, H.-L. Wang, Optimizing Composition and Morphology for Large-Grain Perovskite Solar Cells via Chemical Control. *Chem. Mater.* 27, 5570-5576 (2015). (Refs. 37, 38), the entire contents of all of which are incorporated herein by reference. The PTAA layer was then spin-coated onto the pre-cleaned ITO substrates at 2,000 r.p.m. for 45 s as a hole-transporting layer. The 2D perovskite solutions were prepared by dissolving 2D perovskite single crystals in anhydrous DMF. The thin film fabrication was followed by the hot-casting process, which followed the procedures detailed in H. Tsai, W. Nie, J.-C. Blancon, C. C. Stoumpos, C. M. M. Soe, J. Yoo, J. Crochet, S. Tretiak, J. Even, A. Sadhanala, G. Azzellino, R. Brenes, P. M. Ajayan, V. Bulović, S. D. Stranks, R. H. Friend, M. G. Kanatzidis, A. D. Mohite, Stable Light-Emitting Diodes Using Phase-Pure Ruddlesden—Popper Layered Perovskites. *Adv. Mater.* 30, 1704217 (2018); H. Tsai, W. Nie, J.-C. Blancon, C. C. Stoumpos, R. Asadpour, B. Harutyunyan, A. J. Neukirch, R. Verduzco, J. J. Crochet, S. Tretiak, L. Pedesseau, J. Even, M. A. Alam, G. Gupta, J. Lou, P. M. Ajayan, M. J. Bedzyk, M. G. Kanatzidis, A. D. Mohite, High-efficiency two-dimensional Ruddlesden—Popper perovskite solar cells. *Nature* 536, 312-316 (2016); H. Tsai, R. Asadpour, J.-C. Blancon, C. C. Stoumpos, O. Durand, J. W. Strzalka, B. Chen, R. Verduzco, P. M. Ajayan, S. Tretiak, J. Even, M. A. Alam, M. G. Kanatzidis, W. Nie, A. D. Mohite, Light-induced lattice expansion leads to high-efficiency perovskite solar cells. *Science* 360, 67 (2018); W. Nie, H. Tsai, R. Asadpour, J.-C. Blancon, A. J. Neukirch, G. Gupta, J. J. Crochet, M. Chhowalla, S. Tretiak, M. A. Alam, H.-L. Wang, A. D. Mohite, High-efficiency solution-processed perovskite solar cells with millimeter-scale grains. *Science* 347, 522-525 (2015); H. Tsai, W. Nie, P. Cheruku, N. H. Mack, P. Xu, G. Gupta, A. D. Mohite, H.-L. Wang, Optimizing Composition and Morphology for Large-Grain Perovskite Solar Cells via Chemical Control. *Chem. Mater.* 27, 5570-5576 (2015); and W. Nie, H. Tsai, J.-C. Blancon, F. Liu, C. C. Stoumpos, B. Traore, M. Kepenekian, O. Durand, C. Katan, S. Tretiak, J. Crochet, P. M. Ajayan, M. Kanatzidis, J. Even, A. D. Mohite, Critical Role of Interface and Crystallinity on the Performance and Photostability of Perovskite Solar Cell on Nickel Oxide. *Adv. Mater.* 30, 1703879 (2018), the entire contents of all of which are incorporated herein by reference. The C60 layer and Au electrode (0.04 cm²) were deposited using a thermal evaporator.

Linear X-ray Absorption Coefficient Calculation

The absorption coefficient μ of a compound is the sum of the mass fractions of all elements in the compound, and can be represented by Equation 1.

$$\mu = \sum_i f_i \mu_i = \frac{\sum_i N_i A_i \mu_i}{\sum_i N_i A_i} \quad \text{Equation 1}$$

In Equation 1, i denotes the elements of the compound, $f_i$ is the mass fraction of element i, $\mu_i$ is the absorption coefficient of element i, $N_i$ is the number of atoms of element i in the compound, and $A_i$ is the atomic weight of element i.

For example, for $MAPbI_3$ (i.e., $CH_3NH_3PbI_3$), the empirical formula can be expressed as $CNH_6PbI_3$. From this, the absorption coefficient μ can be calculated according to Equation 2.

$$\mu_{MAPbI_3} = (A_C\mu_C + A_N\mu_N + 6A_H\mu_H + A_{Pb}\mu_{Pb} + 3A_I\mu_I) / (A_C + A_N + 6A_H + A_{Pb} + 3A_I) \quad \text{Equation 2}$$

The absorption coefficients for the 2D RP devices are determined the same way. Equations 3-5 are representative examples of these calculations.

$$\mu(BA)_2(MA)Pb_2I_7 = \frac{(9A_C\mu_C + 2A_N\mu_N + 30A_H\mu_H + 2A_{Pb}\mu_{Pb} + 7A_I\mu_I)}{(9A_C + 2A_N + 30A_H + 2A_{Pb} + 7A_I)}$$

$$\mu(BA)_2(MA)_2Pb_3I_{10} = \frac{(10A_C\mu_C + 3A_N\mu_N + 36A_H\mu_H + 3A_{Pb}\mu_{Pb} + 10A_I\mu_I)}{(10A_C + 3A_N + 36A_H + 3A_{Pb} + 10A_I)}$$

$$\mu(BA)_2(MA)_3Pb_4I_{13} = \frac{(11A_C\mu_C + 4A_N\mu_N + 42A_H\mu_H + 4A_{Pb}\mu_{Pb} + 13A_I\mu_I)}{(11A_C + 4A_N + 40A_H + 4A_{Pb} + 13A_I)}$$

Figure 1B:
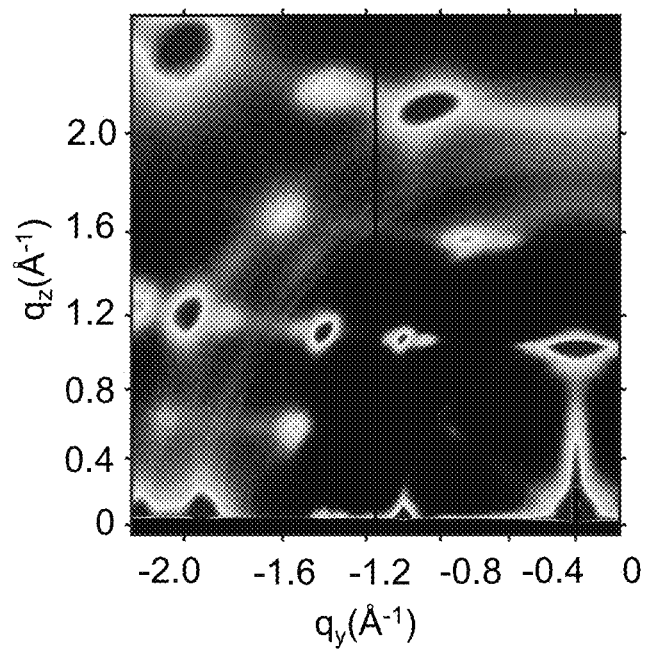
FIG. 1B is a GIWAXS map of a 2D RP thin film done under synchrotron beam according to embodiments of the present disclosure.

The unit for the absorption coefficient μ is cm²/g. It is sometimes simpler to use the linear absorption coefficient $\mu_l$, which has the unit 1/cm (see FIG. 1B). $\mu_l = \mu^* \rho$, where ρ is the density of the material. The mass density of the materials (φ used in FIG. 1B are 2.329 g/cm³ (silicon), 4.130 g/cm³ ($MAPbI_3$), 3.159 g/cm³($BA_2MAPb_2I_7$), 3.392 g/cm3 ($BA_2MA_2Pb_3I_{10}$) and 3.543 g/cm3 ($BA_2MA_3Pb_4I_{13}$), respectively. See Z. Lian, Q. Yan, Q. Lv, Y. Wang, L. Liu, L. Zhang, S. Pan, Q. Li, L. Wang, J.-L. Sun, High-Performance Planar-Type Photodetector on (100) Facet of $MAPbI_3$ Single Crystal. *Sci. Rep.* 5, 16563 (2015); and C. C. Stoumpos, D. H. Cao, D. J. Clark, J. Young, J. M. Rondinelli, J. I. Jang, J. T. Hupp, M. G. Kanatzidis, Ruddlesden—Popper Hybrid Lead Iodide Perovskite 2D Homologous Semiconductors. *Chem. Mater.* 28, 2852-2867 (2016), the entire contents of all of which are incorporated herein by reference.

Detector Measurement Setup

Synchrotron X-ray has mono energy of 10.91 keV with photon flux of $4.6 \times 10^{10}$ Ct s⁻¹. The various incident photon flux is controlled by changing a series of Al foils of varying thicknesses which allows attenuation of the desired beam flux during measurement. The footprint of the beam is 20 mm×0.2 mm with 0.15° incident angle. Part of the experiments were performed with a Bruker D8 advance X-ray diffractometer with X-ray energy of 8.05 keV with 2 theta=45°.

X-Ray Dosage Calculation

Synchrotron-based characterization of the devices took place at beam line 8-ID-E of the Advanced Photon Source, Argonne National Laboratory, as described in Z. Jiang, GIXSGUI: a MATLAB toolbox for grazing-incidence X-ray scattering data visualization and reduction, and indexing of buried three-dimensional periodic nanostructured films. *J. Appl. Crystallogr.* 48, 917-926 (2015), the entire content of which is incorporated herein by reference. Beam line 8-ID-E is insertion-device-based with two APS Undulator A units operated in tandem as the source, which is shared with Beamline 8-ID-I. A single-bounce monochromator Si (111) crystal intercepts half of the beam and directs the component with photon energy E=10.91 keV into the Grazing-Incidence Wide-angle X-ray Scattering (GIWAXS) instrument at Advance Photon Source, Argonne National Laboratory. Samples were investigated in a vacuum sample environment ($3\times10^{-3}$ torr) for GIWAXS that is coupled to the beamline with a flexible vacuum bellows, so there are no windows between the X-rays and the sample, except for a highly polished Be window separating the beamline vacuum from the vacuum at the monochromator and further upstream. Two sets of in-vacuum slits (JJ X-ray A/S) defined the size of the beam as 200 μm×20 μm (H×V), with a third set of in-vacuum slits as guard slits. A series of Al foils of varying thicknesses mounted in two sets of pneumatically operated filter banks positioned between the first and second set of slits allowed attenuation of the beam as desired during measurements. The unattenuated x-ray flux at a position in between the second and third set of slits with a calibrated p-i-n diode was measured to be $(4.61\pm0.05)\times10^{10}$ ph/s with the storage ring current operating at 101.8 mA, in top-up operations mode. This p-i-n diode was retracted during measurements of the sample. During measurements, the X-ray beam impinged on the sample in grazing-incidence, with incident angle $\alpha_i$=0.15°, resulting in a X-ray footprint on the sample of 200 μm×20 mm. In this manner, the fluence of the beam was reduced from a maximum of $(1.15\pm0.01)\times10^{13}$ to $(3.02\pm0.03)\times10^{10}$ ph/mm². The perovskite-based p-i-n diode devices tested were fabricated to dimensions of 2 mm×2 mm in order to capture all of the incident X-ray beam. The commercial p-i-n diodes tested for comparison had dimensions of 100 mm×2 mm. Samples were tested under vacuum at a temperature of 25° C. as maintained by a Linkam HFSX350-GI stage with liquid nitrogen cooling.

The dosage calculation for the mono-energetic (10.91 keV) X-ray source is calculated by Equation 6.

$$\frac{\Phi}{X} = \frac{5.43\times10^5}{(\mu[E]/\rho)_{en}E} \frac{\text{Photons}}{\text{mm}^2 mR} \quad \text{Equation 6}$$

In Equation 6, Ø is the photon fluence (in photons/mm²) and X is the exposure (mR) where 1 mR=$8.9\times10^{-6}$ Gy$_{air}$. The Ø/X value can be obtained as described in W. Pan, H. Wu, J. Luo, Z. Deng, C. Ge, C. Chen, X. Jiang, W.-J. Yin, G. Niu, L. Zhu, L. Yin, Y. Zhou, Q. Xie, X. Ke, M. Sui, J. Tang, Cs2AgBiBr6 single-crystal X-ray detectors with a low detection limit. *Nat. Photon.* 11, 726-732 (2017); and H. E. Johns, J. R. Cunningham, *The Physics of Radiology*, Fourth Ed. (Charles Thomas, Springfield, Ill., 1983), the entire contents of all of which are incorporated herein by reference.

Figure 15:
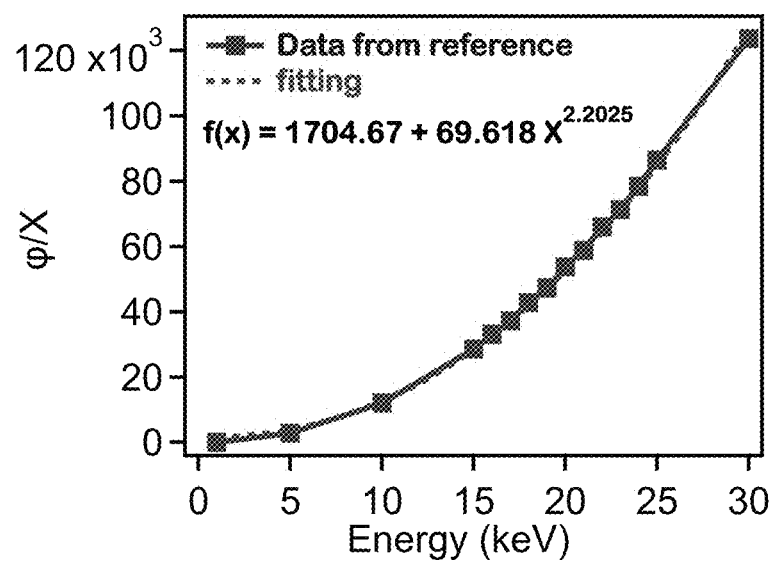
FIG. 15 is a plot of ϕ/X as a function of energy with fitting (adapted from W. Wei, Y. Zhang, Q. Xu, H. Wei, Y. Fang, Q. Wang, Y. Deng, T. Li, A. Gruverman, L. Cao, J. Huang, Monolithic integration of hybrid perovskite single crystals with heterogenous substrate for highly sensitive X-ray imaging. Nat. Photon. 11, 315 (2017), the entire content of which is incorporated herein by reference)

FIG. 15 is a plot of the Ø/X for energy between 1-30 keV, with the curve fitted according to the power law (Equation 7).

$$f(x)=1704.67+69.618X^{2.2025} \quad \text{Equation 7}$$

Therefore, Ø/X for 10.91 keV can be obtained, and the value is 15148.73 photons/mm²/mRØ.

Additionally, taking W$_{air}$=33.8 eV, the total exposure can be calculated by Equation 8.

$$X = \frac{\text{total charge ionized}}{\text{total mass}} = \frac{\text{photon flux} \times \frac{\text{Energy}}{W}}{\text{total mass}} \quad \text{Equation 8}$$

Assuming the area is 1 cm², and the mass attenuation coefficient for air (10 keV X-ray) is estimated to be 4.72 cm²/g, the X-ray stopping length is about 1000 cm. The total exposure over 1 cm² area is calculated using Equation 8:

$$X = \frac{3.01\times10^{12} \times \frac{10910}{33.8} \times 1.6\times10^{-19}}{1000 \text{ cm} \times 1.2754 \text{ kg/m}^3} = 0.136 \text{ C/kg}$$

Considering 1 R=2.58e-4 C/kg, and 1 R=0.00877 Gy$_{air}$, the total exposure over air at the maximum photon flux used here is 4.419 Gy$_{air}$ per second.

Sensitivity Calculation

From the X-ray dosage calculation, the dosage (μGy$_{air}$ s$^{-1}$) for the 2D RP device under various photon flux has been calculated, and the device's current density (A cm$^{-2}$) converted into charge density (C cm$^{-2}$ s$^{-1}$). Therefore, the sensitivity for the device is 0.276 C Gy$_{air}^{-1}$ cm$^{-3}$.

Thickness Calculation

Figure 4:
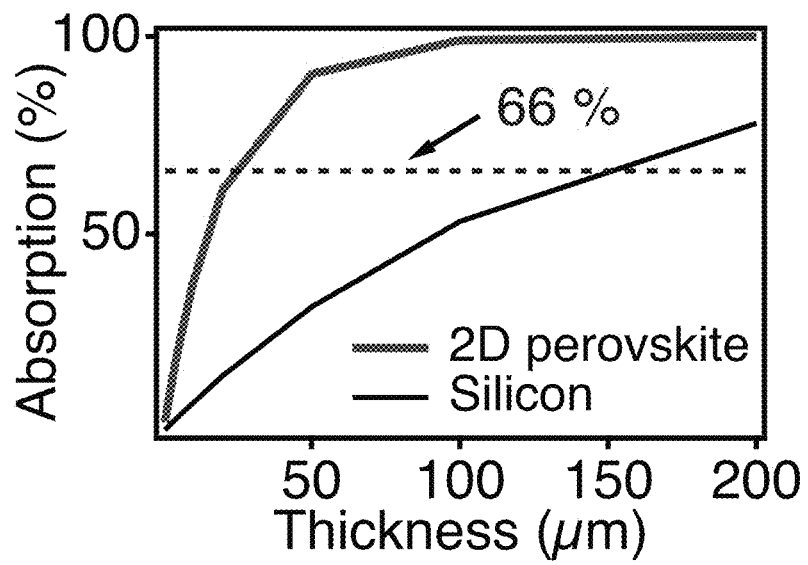
FIG. 4 is graph comparing the X-ray absorption as a function of layer thickness for 10.96 keV X-ray of a Pb3 film (red trace) and a silicon device (black trace)

After running a simple calculation based on the linear absorption coefficient data, the absorption can be plotted as a function of thickness. See FIG. 4. As can be seen in FIG. 4, the layered perovskite benefits from the heavy element, allowing a 20 μm thin film to stop 66% of the incident X-ray (10.91 keV), and a 100 μm layer to stop 100% of the X-ray at the same energy. This shows that the device has a fully depleted junction across a "thin perovskite layer," and offers various advantages over a bulk device. This device performance can be maintained using a thicker film (e.g., 20 μm) when interface layers are optimized (e.g., using heavily doped p or n contacts) to fully deplete the junction.

Device Characterization

Figure 5A:
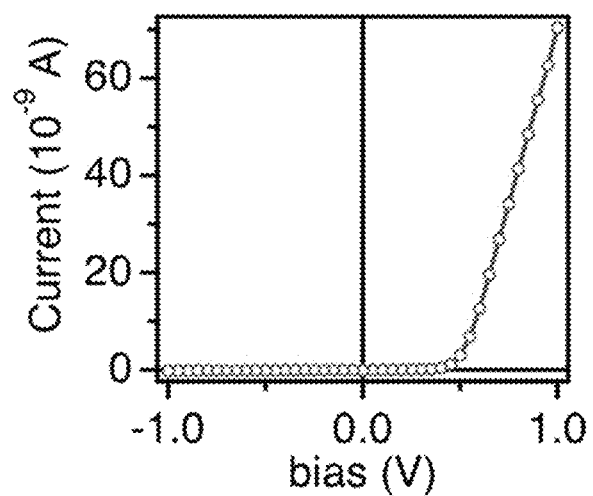
FIG. 5A is a dark current-voltage curve for a device according to embodiments of the present disclosure in dark.
Figure 5B:
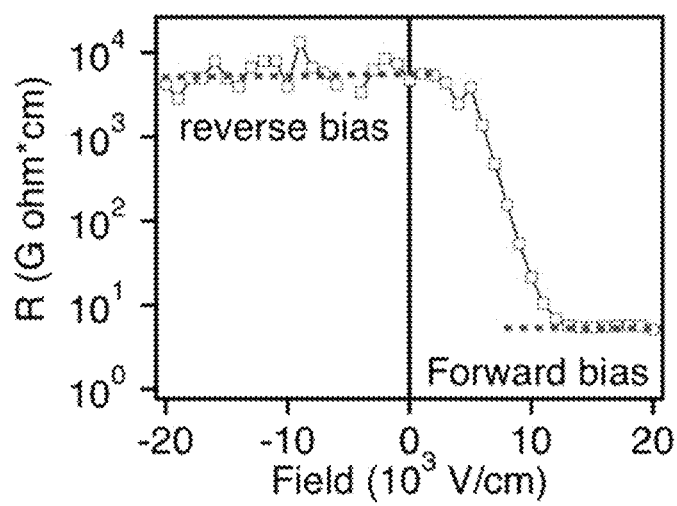
FIG. 5B is a graph depicting dark resistivity of the device from FIG. 5A.

FIGS. 5A-B are plots of the dark current as a function of bias, and in FIG. 5B, the current-voltage curve is converted to a resistivity-electrical field curve. As can be seen in FIGS. 5A-B, the diode's resistivity in the −20 kV/cm to 5 kV/cm field range is flattened with an estimated value of 6000 G Ohm*cm. From +5 kV/cm to +10 kV/cm, the dark current increases before forward injection occurs, and the diode's resistivity drops rapidly due to recombination. And above 10 kV/cm, the dark resistivity stabilizes at about 5 G Ohm*cm. Therefore, the 6000 G Ohm*cm value is the diode's resistivity at reverse bias, and the 5 G Ohm*cm should correspond to the material's resistivity.

Figure 5C:
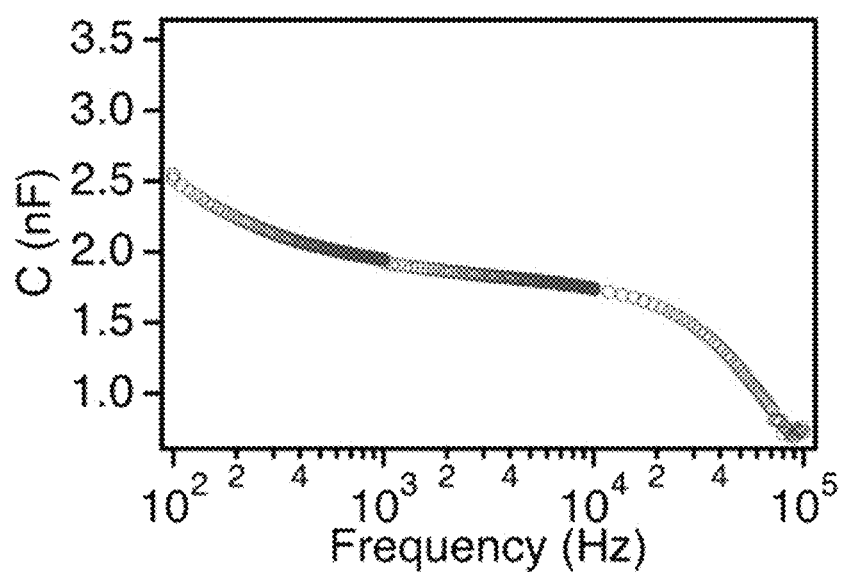
FIG. 5C is a graph depicting capacitance as a function of frequency of the device from FIG. 5A.
Figure 5D:
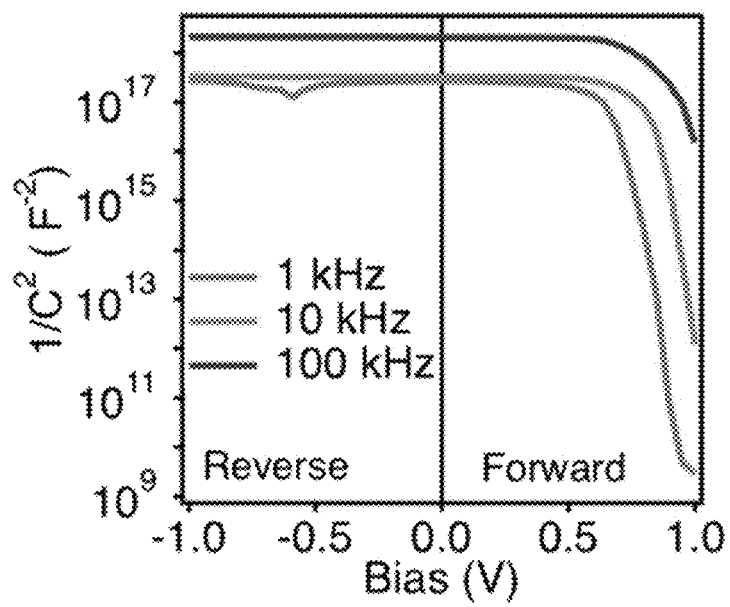
FIG. 5D is a graph depicting capacity as a function of frequency with DC bias at three different frequencies (1 kHz red trace; 10 kHz green trace; 100 kHz blue trace) of the device from FIG. 5A.

FIGS. 5C-D depict the capacitance characteristics of the p-i-n device. The capacitance-frequency curve in FIG. 5C shows the capacitance probed at 0.05 V (RMS voltage) in frequency range of about 0.1 to about 100 kHz. At high frequency, the capacitance value is ~0.7 nF. Taking the dielectric constant as 10, the calculated thickness from the capacitance is about 500 nm, matching the perovskite layer thickness well. When the frequency decreases, the capacitance increases and flattens at around 2.5 nF. The increase in capacitance at lower frequency suggests that more space charges contribute to the capacitance, and those charges respond slower than free charges at the plates. Such increase in planar devices was attributed to the interface capacitance and trap/de-trapping process from below gap states. See M. Burgelman, P. Nollet, Admittance spectroscopy of thin film solar cells. *Solid State Ion.* 176, 2171-2175 (2005); S. S. Hegedus, W. N. Shafarman, Thin-film solar cells: device measurements and analysis. *Prog. Photovolt: Res. Appl.* 12, 155-176 (2004); and T. Walter, R. Herberholz, C. Müller, H. W. Schock, Determination of defect distributions from admittance measurements and application to Cu(In,Ga)Se$_2$ based heterojunctions. *J. Appl. Phys.* 80, 4411-4420 (1996), the entire contents of all of which are incorporated herein by reference. FIG. 5D is a plot of the capacitance-voltage curve following the Mott-Schottky Equation (See S. S. Hegedus, W. N. Shafarman, Thin-film solar cells: device measurements and analysis. *Prog. Photovolt: Res. Appl.* 12, 155-176 (2004), the entire content of which is incorporated herein by reference).

$$\frac{1}{C^2} = \frac{2}{\varepsilon_r \varepsilon_0 A^2 e N_d}\left(V - V_{fb} - \frac{K_b T}{e}\right) \quad \text{Mott-Schottky Equation}$$

This relation is derived for p-n junction devices, where C is junction capacitance, Nd refers to the doping density, and $V_{fb}$ is the flat band voltage. Because the device includes a p-i-n diode, the $1/C^2$-V curve at reverse bias and moderate forward bias (0.5 V) flattens, and the value decrease (C increases) at lower frequency, which is consistent with the C-f curve. The flattened $1/C^2$-V curve suggests that the p-i-n junction is fully depleted and reverse bias does not extract more charges that contribute to the capacitance value. In the forward bias regime, after the diode turns on (+0.5 Volt from J-V curve in FIG. 5A), the $1/C^2$ value rapidly decreases and the charge density can be estimated by the slope of the curve.

Therefore, the extracted doping density at 100 kHz, 10 kHz and 1 kHz are $1.71\times10^{15}$ cm$^{-3}$, $8.85\times10^{15}$ cm$^{-3}$ and $1.02\times10^{16}$ cm$^{-3}$, respectively. The increase in charge density could originate from charge released from the trap states when driving the capacitance at lower frequency.

Detector Sensitivity

In Table 1 below, the sensitivity of the detector is compared with other perovskite based bulk crystal detectors. As can be seen, the detector according to embodiments of the present disclosure represents the highest sensitivity value among the literature reported values (note that different units are utilized in different literature, and in Table 1 all the reported values are converted into the same unit). To validate the measured values, the reference silicon p-i-n diode response tested under the same conditions was evaluated. The reference diode has low dark resistivity of $10^{11}$ $\Omega$cm. The sensitivity for this reference diode was measured as 20 $\mu$C Gy$^{-1}_{air}$ cm$^{-2}$ at −1 V. This translates to 200 electrons collected per incident X-ray photon each second. This value is comparable to the performance reported in the literature from a commercial silicon p-i-n diode (i.e., the sensitivity is reported as 100 $\mu$C Gy$^{-1}_{air}$ cm$^{-2}$ in J. Chabbal, C. Chaussat, T. Ducourant, L. Fritsch, J. Michailos, V. Spinnler, G. Vieux, M. Argues, G. Hahm, M. Hoheisel, H. Horbaschek, R. F. Schulz, M. F. Spahn, *Amorphous silicon x-ray image sensor*. Medical Imaging 1996 (SPIE, 1996), vol. 2708, the entire content of which is incorporated by reference, and typical Si p-i-n diodes collect 300-3000 electron per X-ray photon per second at 11 keV, as reported in R. L. Owen, J. M. Holton, C. Schulze-Briese, E. F. Garman, Determination of X-ray flux using silicon pin diodes. *J. Synchrotron Radiat.* 16, 143-151 (2009), the entire content of which is incorporated herein by reference). Bulk crystal detectors do not offer advantages on the sensitivity of low energy X-ray detection (<20 keV) over the thin film detectors. Further, the measurement here is done with low sensitive electronics in DC mode with a Keithley 2400 SMU unit, while other studies employed lock-in amplifiers to greatly reduce the dark noise. Therefore, the lowest detectable dosage reported here can be lowered if the electronics are improved.

TABLE 1

Comparing detector performance in reported perovskite-based X-ray detectors

| | Detector (thickness) | Sensitivity (C Gy$^{-1}_{air}$cm$^{-3}$) | Lowest detectable dosage ($\mu$Gy s$^{-1}$) | Dark resistivity $\Omega$ cm | Amplifier | X-ray Energy (keV) | Literature |
|---|---|---|---|---|---|---|---|
| Single crystals | MAPbBr$_3$ (2 mm) | 0.105 | 0.036 | $10^6$ | Lock-in | 8 | W. Wei, Y. Zhang, Q. Xu, H. Wei, Y. Fang, Q. Wang, Y. Deng, T. Li, A. Gruverman, L. Cao, J. Huang, Monolithic integration of hybrid perovskite single crystals with heterogenous substrate for highly sensitive X-ray imaging. *Nat. Photon.* 11, 315 (2017), the entire content of which is incorporated herein by reference |
| | MAPbBr$_3$ (3 mm) | 0.0002667 | 0.5 | $10^7$ | Lock-in | 50 | H. Wei, Y. Fang, P. Mulligan, W. Chuirazzi, H.-H. Fang, C. Wang, B. R. Ecker, Y. Gao, M. A. Loi, L. Cao, J. Huang, |

TABLE 1-continued

Comparing detector performance in reported perovskite-based X-ray detectors

| | Detector (thickness) | Sensitivity (C Gy$^{-1}_{air}$cm$^{-3}$) | Lowest detectable dosage (μGy s$^{-1}$) | Dark resistivity Ω cm | Amplifier | X-ray Energy (keV) | Literature |
|---|---|---|---|---|---|---|---|
| | | | | | | | Sensitive X-ray detectors made of methylammonium lead tribromide perovskite single crystals. *Nat. Photon.* 10, 333 (2016), the entire content of which is incorporated herein by reference |
| | MAPbI$_3$ (1 mm) | 0.02527 | <1000 | 10$^5$ | AC | 38 | S. Shrestha, R. Fischer, G. J. Matt, P. Feldner, T. Michel, A. Osvet, I. Levchuk, B. Merle, S. Golkar, H. Chen, S. F. Tedde, O. Schmidt, R. Hock, M. Rührig, M. Göken, W. Heiss, G. Anton, C. J. Brabec, High-performance direct conversion X-ray detectors based on sintered hybrid lead triiodide perovskite wafers. *Nat. Photon.* 11, 436 (2017), the entire content of which is incorporated herein by reference |
| | Cs$_2$AgBiBr$_6$ (2 mm) | 0.000525 | 0.06 | 10$^{11}$ | High Resolution | 30 | W. Pan, H. Wu, J. Luo, Z. Deng, C. Ge, C. Chen, X. Jiang, W.-J. Yin, G. Niu, L. Zhu, L. Yin, Y. Zhou, Q. Xie, X. Ke, M. Sui, J. Tang, Cs2AgBiBr6 single-crystal X-ray detectors with a low detection limit. *Nat. Photon.* 11, 726-732 (2017), the entire content of which is incorporated herein by reference |
| Thin films | MAPbI$_3$ (600 nm) | 0.025 | <1000 | 10$^9$ | Lock-in | 37 | S. Yakunin, M. Sytnyk, D. Kriegner, S. Shrestha, M. Richter, G. J. Matt, H. Azimi, C. J. Brabec, J. Stangl, M. V. Kovalenko, W. Heiss, Detection of X-ray photons by solution-processed lead halide perovskites. *Nat. Photon.* 9, 444 (2015), the entire content of which is incorporated herein by reference |
| | MAPbI$_3$ (830 μm) | 0.045783 | <10 | N/A | N/A | 30-80 | Y. C. Kim, K. H. Kim, D.-Y. Son, D.-N. Jeong, J.-Y. Seo, Y. S. Choi, I. T. Han, S. Y. Lee, N.-G. Park, Printable organometallic perovskite enables large-area, low-dose |

TABLE 1-continued

Comparing detector performance in reported perovskite-based X-ray detectors

| Detector (thickness) | Sensitivity (C Gy$^{-1}_{air}$cm$^{-3}$) | Lowest detectable dosage (μGy s$^{-1}$) | Dark resistivity Ω cm | Amplifier | X-ray Energy (keV) | Literature |
|---|---|---|---|---|---|---|
| | | | | | | X-ray imaging. *Nature* 550, 87 (2017), the entire content of which is incorporated herein by reference |
| Silicon p-i-n (600 μm) | 0.000333 | 10$^4$ | 10$^{11}$ | None | 10.91 | Comparative example in this disclosure |
| Layered perovskite (470 nm) | 0.276 | 100 | 10$^{12}$ | None | 10.91 | Embodiments of the present disclosure |

Thickness Dependence

Figure 10A:
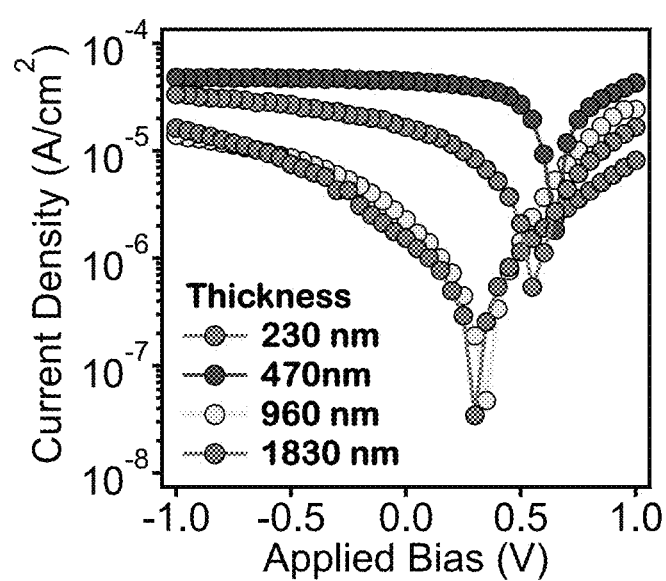
FIG. 10A is graph depicting a J-V characteristic curve of 2D RP devices according to embodiments of the present disclosure having various thicknesses (230 nm blue trace; 470 nm red trace; 960 nm yellow trace; 1830 nm green trace) under the same X-ray beam flux.
Figure 10B:
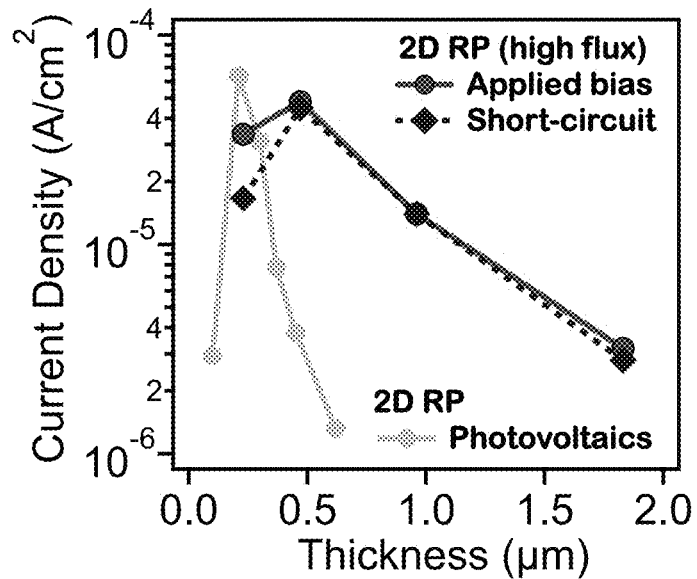
FIG. 10B is a graph depicting the extracted X-ray induced current density response for high photon flux under short-circuit (blue trace) and applied bias conditions (red trace), and the grey trace represents photo illumination current density as a function of layer thickness for comparison.
Figure 11:
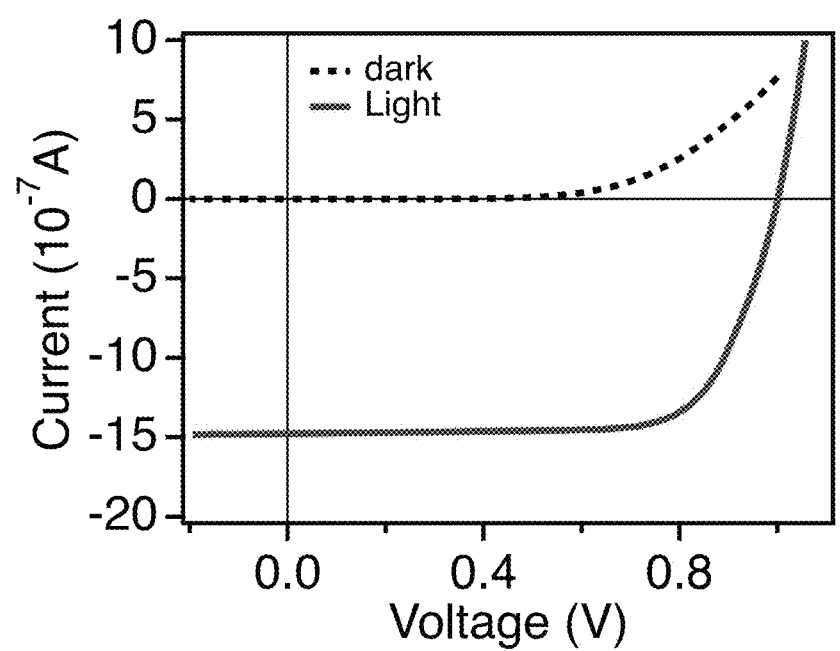
FIG. 11 is a graph depicting a J-V characteristic curve for a 2D RP device (470 nm) according to embodiments of the present disclosure under dark (black dotted trace) and Blue LEDs (405 nm) light (solid red trace) conditions.
Figures 12A, 12B, 12C, 12D:
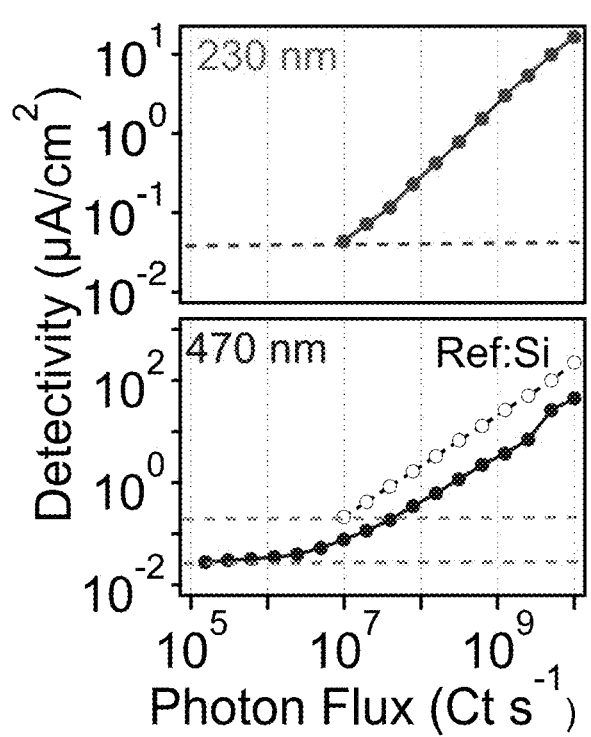
FIG. 12A is a graph depicting the X-ray detection limit for a 230 nm thickness device according to embodiments of the present disclosure under various photon flux at zero bias.
FIG. 12B is a graph depicting the X-ray detection limit for a device with the same device structure as FIG. 12A except for a 960 nm thickness under various photon flux at zero bias.
FIG. 12C is a graph depicting the X-ray detection limit for a device with the same device structure as FIG. 12A except for a 470 nm thickness under various photon flux at zero bias.
FIG. 12D is a graph depicting the X-ray detection limit for a device with the same device structure as FIG. 12A except for a 1830 nm thickness under various photon flux at zero bias.

After characterizing the detector working principles (as discussed above), the performance of the detector was also characterized as a function of absorbing 2D RP layer thicknesses ranging from 230 nm to 1830 nm under a wide range of incident X-ray photon fluxes. See FIG. 10A. This was also compared to the detector's operation under visible light (i.e., blue LEDs at 405 nm), as shown in FIG. 10B, and excitation at similar generated carrier density, as shown in FIG. 11 (device J-V curves under blue LEDs). FIG. 10A shows the J-V curves for various absorbing layer thicknesses in the same device configuration under identical X-ray photon flux exposure. Markedly, moderate thickness dependence of the X-ray induced current amplitude at zero bias is observed. At first, there is an increase from 16.56 μA/cm$^2$(230 nm) to 44.78 μA/cm$^2$ (470 nm), mainly due to the more efficient X-ray photon absorption. As the thickness continues to increase above 1500 nm, the current near zero bias drops to 3.18 μA/cm$^2$ accompanied by a field dependence under reverse bias conditions observed from the increasing slopes for the thicker device. However, by comparing that with photo-generated current in the same device in FIG. 10B, it is observed that 2D RP devices operating as photo detectors possess even stronger thickness dependence compared to the X-ray detection mode under similar carrier density. Such strong thickness dependence by photo-excitation is attributed to the barrier limited transport when carriers are generated near the middle of the film without strong electrical field. See H. Tsai, R. Asadpour, J.-C. Blancon, C. C. Stoumpos, J. Even, P. M. Ajayan, M. G. Kanatzidis, M. A. Alam, A. D. Mohite, W. Nie, Design principles for electronic charge transport in solution-processed vertically stacked 2D perovskite quantum wells. *Nat. Commun.* 9, 2130 (2018), the entire content of which is incorporated herein by reference. Remarkably, the X-ray detectors remain efficient for devices with thicker layers under reverse bias (see data in FIG. 10A and FIG. 12).

Figure 10C:
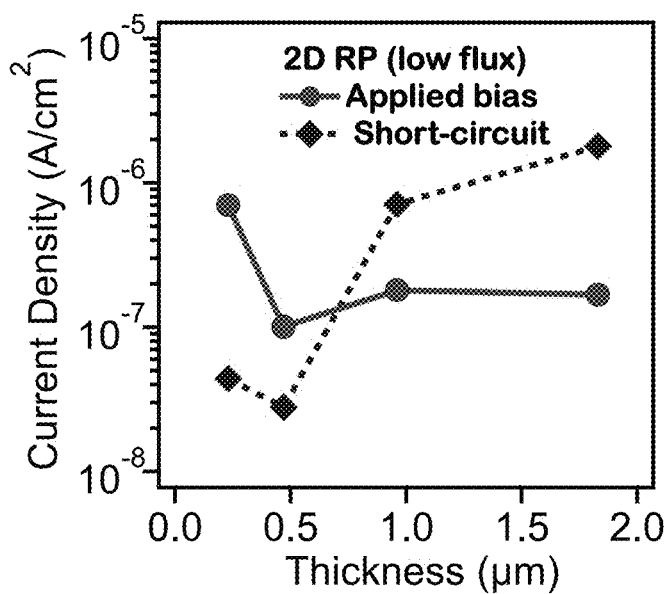
FIG. 10C is a graph depicting extracted X-ray induced current density response for low photon flux under short-circuit (blue trace) and applied bias conditions (red trace)

The low dosage exposure condition was also examined, and the results are shown in FIG. 10C. The detectivity has a similar trend in thickness range up to about 500 nm; however, there is a dramatic change in detectivity for higher thicknesses. This change is attributed to the high dark current and possible trap recombination in the thicker absorbing layer.

Hence, in contrast to photo-diode operation regimes, 2D RP devices can operate efficiently as radiation detectors due to robust detection efficiency exhibiting weaker thickness and field dependence: X-rays penetrate deeper in thin film than visible photons, and generate substantial charges across the layer thickness to be collected. Even thick film devices with absorbing layers wider than 2 μm remain efficient under mild reverse bias (FIG. 10C). This also suggests that 2D RP devices with thicker layers can be potentially used for higher energy radiation (e.g., hard X-ray or low energy gamma-ray) without significant bias.

As discussed herein, according to embodiments of the present disclosure, a thin film X-ray detector includes highly crystalline 2D Ruddlesden-Popper (RP) phase layered perovskites fabricated in a fully depleted p-i-n architecture. In some embodiments, as discussed herein, the thin film X-ray detector has high diode resistivity, for example on the order of 10$^{12}$ Ωcm, in a reverse bias regime, leading to a high X-ray detecting sensitivity, for example, up to about 0.276 C Gy$_{air}^{-1}$cm$^{-3}$. Such high signal is collected by the built-in potential underpinning operation of a primary photocurrent device with robust operation. The thin film X-ray detectors according to embodiments of the present disclosure generate significant X-ray photon induced open circuit voltages that offer an alternative detecting mechanism. The thin film X-ray detectors according to embodiments of the present disclosure are constructed with low-cost layered perovskite thin films, and can be used for next generation, or future X-ray imaging technologies.

In some embodiments, for example, as shown in FIG. 1A and discussed earlier herein, a thin film X-ray (or radiation) detection device includes a p-i-n junction configuration including a p-type semiconductor contact layer, an n-type semiconductor contact layer, and an intrinsic layer between the p-type and n-type contact layers and including a thin film including a highly crystalline 2D RP phase layered perovskite material to efficiently detect X-ray (or radiation) photons. In some embodiments, for example (and as discussed in the Examples above) the 2D Ruddlesden-Popper (RP) phase layered perovskite may be represented by (BA)$_2$(MA)$_2$Pb$_3$I$_{10}$ ("Pb3").

Referring generally to FIG. 1A, the thin film radiation detection device used in the Examples and Characterization schemes employed an indium tin oxide (ITO)/p-type contact/2D RP thin film/n-type contact/gold structure. The p-type contact was poly[bis(4-phenyl) (2,4,6-trimethylphenyl) amine (PTAA), and the n-type contact was C$_{60}$. FIG. 1B shows the synchrotron grazing incidence wide-angle X-ray scattering (GIWAXS) measurement, which confirms the superior crystalline and preferred orientation in 2D RP thin film.

Figure 1C:
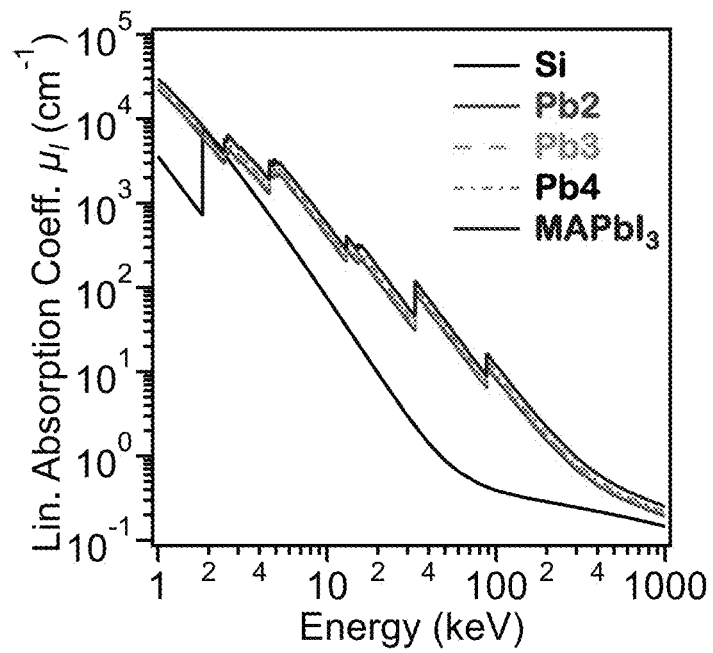
FIG. 1C is a graph of the calculated linear X-ray absorption coefficient ($\mu_l$) as a function of incident radiation energy for several hybrid perovskite materials (red traces, green traces, block dotted traces, and blue traces) and silicon (solid black trace)

To evaluate the feasibility of the 2D RP perovskites as radiation detectors, the linear X-ray absorption coefficient (μ$_l$) as a function of incident energy was calculated (as discussed above) for the 2D RPs, 3D methylammonium lead tri-iodide perovskite (MAPbI$_3$), and silicon (Si). The results are plotted in FIG. 1C. The absorption coefficients of these perovskite materials are on average 10-40 folds higher than that of silicon for hard X-ray. It is interesting to note that the $\mu_l$ for both 2D and 3D perovskites are similar, which suggests that the presence of the large organics in the 2D perovskites does not affect the X-ray absorption coefficients which are dominated by the heavy elements. Considering such strong X-ray absorption of the perovskite materials (FIG. 4), the thin film p-i-n detector was tested under X-ray. The 2D RP X-ray absorber layers were fabricated with the hot casting approach described in, for example, H. Tsai, W. Nie, J.-C. Blancon, C. C. Stoumpos, R. Asadpour, B. Harutyunyan, A. J. Neukirch, R. Verduzco, J. J. Crochet, S. Tretiak, L. Pedesseau, J. Even, M. A. Alam, G. Gupta, J. Lou, P. M. Ajayan, M. J. Bedzyk, M. G. Kanatzidis, A. D. Mohite, High-efficiency two-dimensional Ruddlesden—Popper perovskite solar cells. *Nature* 536, 312-316 (2016), H. Tsai, R. Asadpour, J.-C. Blancon, C. C. Stoumpos, O. Durand, J. W. Strzalka, B. Chen, R. Verduzco, P. M. Ajayan, S. Tretiak, J. Even, M. A. Alam, M. G. Kanatzidis, W. Nie, A. D. Mohite, Light-induced lattice expansion leads to high-efficiency perovskite solar cells. *Science* 360, 67 (2018), and W. Nie, H. Tsai, R. Asadpour, J.-C. Blancon, A. J. Neukirch, G. Gupta, J. J. Crochet, M. Chhowalla, S. Tretiak, M. A. Alam, H.-L. Wang, A. D. Mohite, High-efficiency solution-processed perovskite solar cells with millimeter-scale grains. *Science* 347, 522-525 (2015), the entire contents of all of which are incorporated herein by reference. This formed highly crystalline thin films which achieve enhanced charge transport and collection across the two electrodes, as described in H. Tsai, R. Asadpour, J.-C. Blancon, C. C. Stoumpos, J. Even, P. M. Ajayan, M. G. Kanatzidis, M. A. Alam, A. D. Mohite, W. Nie, Design principles for electronic charge transport in solution-processed vertically stacked 2D perovskite quantum wells. *Nat. Commun.* 9, 2130 (2018), the entire content of which is incorporated herein by reference. As discussed above, the 2D RP perovskites, their thin films, and methods of making them are described in detail in U.S. patent application Ser. No. 15/641,142, filed on Jul. 3, 2017, titled "HIGH-EFFICIENCY AND DURABLE OPTOELECTRONIC DEVICES USING LAYERED 2D PEROVSKITES," and naming Triad National Security, LLC as the Applicant, the entire content of which is incorporated herein by reference.

Figure 1D:
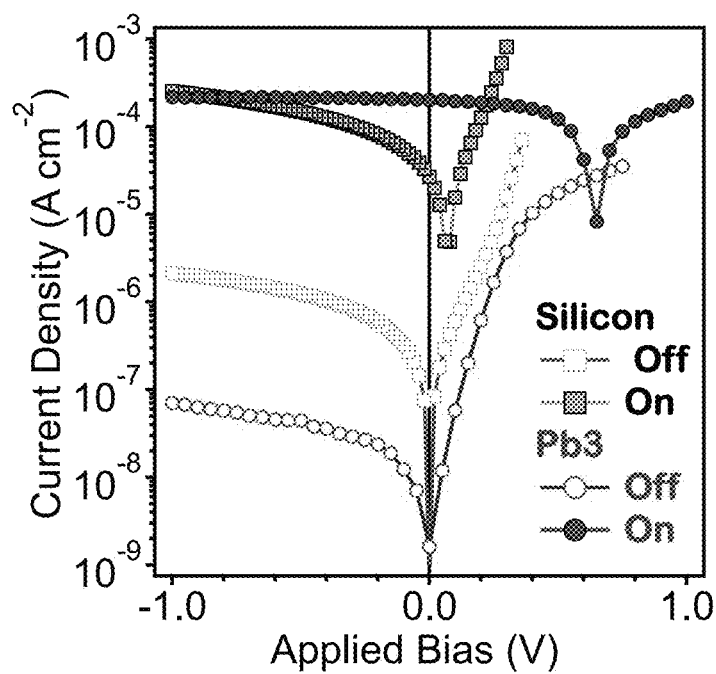
FIG. 1D is a graph of the J-V characteristics for 2D RP (red traces) and silicon reference (black traces) devices in dark and under X-ray (10.91 keV) exposure.
Figure 1E:
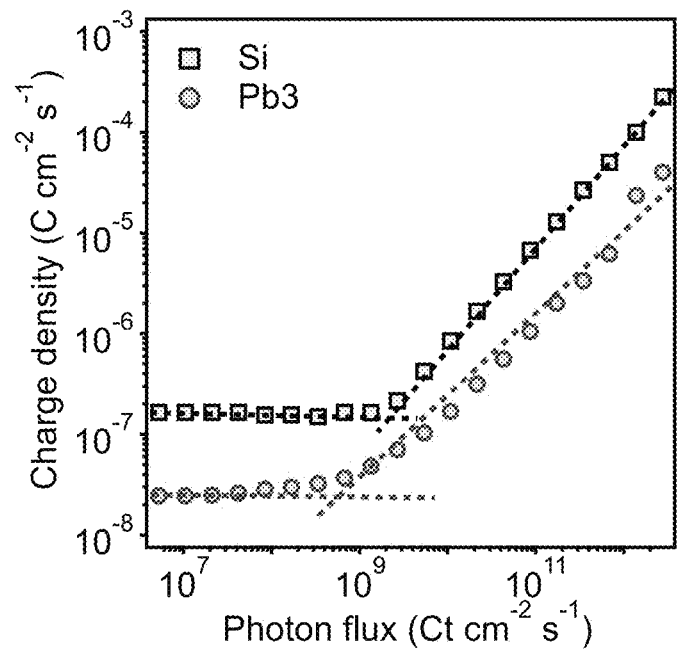
FIG. 1E is a graph of the X-ray generated charge density as a function of X-ray photon flux for 2D RP (red trace) and silicon diode (black trace) under zero bias.
Figure 1F:
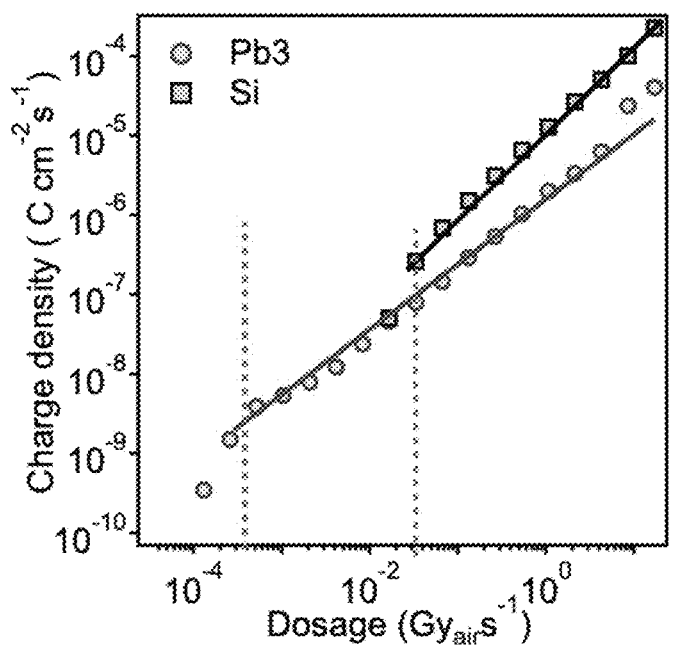
FIG. 1F is a graph of the X-ray induced charge density subtracted by the dark noise (signal-to-noise ratio) for a 2D RP (red trace) and silicon reference (black trace) detectors from FIG. 1E.
Figure 6:
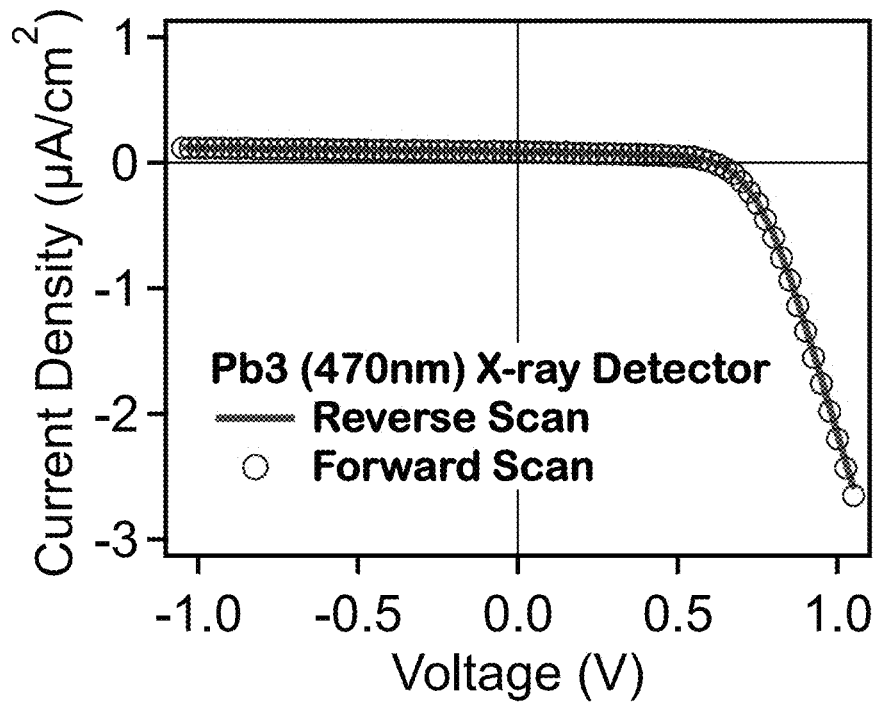
FIG. 6 is a graph depicting X-ray induced J-V curves from hysteresis testing for a 2D RP (470 nm) X-ray detector according to embodiments of the present disclosure with reverse (red line trace) and forward (blue circular trace) scan direction.

FIGS. 1D-F summarize the detector's performance made with a 470 nm 2D RP thin film when measuring in dark and under synchrotron beam with mono energy of 10.91 keV and photon flux of $2.7 \times 10^{12}$ photon counts per cm$^2$ per second (Ct cm$^{-2}$ s$^{-1}$) (X-ray photon flux calibration is described above). As a reference, the commercial silicon p-i-n diode (600 µm thick) was measured under the same condition. The current density-voltage characteristics (J-V) in dark and under X-ray exposure as plotted in FIG. 1D are employed to describe the devices' responses. Benefitting from the p-i-n junction design, the dark current density for the 2D RP device is as low as $10^{-9}$ A cm$^{-2}$ at zero bias, and $10^{-7}$ A cm$^{-2}$ at −1 V, which translates to a high dark resistivity of $10^{12}$ Ωcm coming from the diode due to the efficient dark current blocking layers. The material's intrinsic dark resistivity is calculated to be 5 GΩcm by the forward injection regime (FIG. 5). Once the devices are exposed to the X-ray source, the 2D RP device shows a significant increase in X-ray induced current density (Jx) at zero bias (short-circuit), 4-orders of magnitude higher than the dark current (FIG. 1D). As a comparison, the Si device was placed under the same X-ray exposure condition, and only output a 2-orders of magnitude increase in Jx (FIG. 1D, black). Notably, the Pb3 devices are hysteresis-free in dark and under X-ray illumination (FIG. 6). Interestingly, the 2D RP device also generates a large open circuit voltage (Voc) of about 650 mV under X-ray exposure, while that for the Si diode was only about 250 mV. Both the high Voc and significant Jx produced at short circuit are attributed to the high density of charge carriers generated in the 2D RP accredited to the high absorption cross-section and low non-radiative recombination in the crystalline thin film.

To quantify the detector's detection limit, the charge density was extracted from Jx under zero bias with various X-ray photon flux for the 2D RP and silicon devices; these are plotted in FIG. 1E. The detecting photon density limit for the 2D RP device is about $5 \times 10^8$ Ct s$^{-1}$ cm$^{-2}$. Compared to the Si reference device ($3 \times 10^9$ Ct s$^{-1}$ cm$^{-2}$), this value is lower due to the low dark current for the former. The ionization energy for the 2D RP material was calculated to validate the results. The formula for ionization energy estimation is:

$$\text{Ionization Energy } (W_\pm) =$$
$$\text{amount of energy required to create one } e-h \text{ pair} =$$
$$\frac{\text{total energy absorbed}}{\text{total } e-h \text{ pairs created}}$$

Here, there are (a) total e-h pairs (EHPs) created and (b) total energy absorbed (see S. O. Kasap, J. A. Rowlands, Direct-conversion flat-panel X-ray image sensors for digital radiography. *Proc. IEEE* 90, 591-604 (2002), the entire content of which is incorporated herein by reference):

$$\text{Total } e-h \text{ pairs created} = \frac{\text{charge extracted}}{q} \quad (a)$$

$$\text{Total energy absorbed} = \quad (b)$$
$$\text{photon density} * \text{photon energy} * \text{device quantum efficiency}$$

Figure 7:
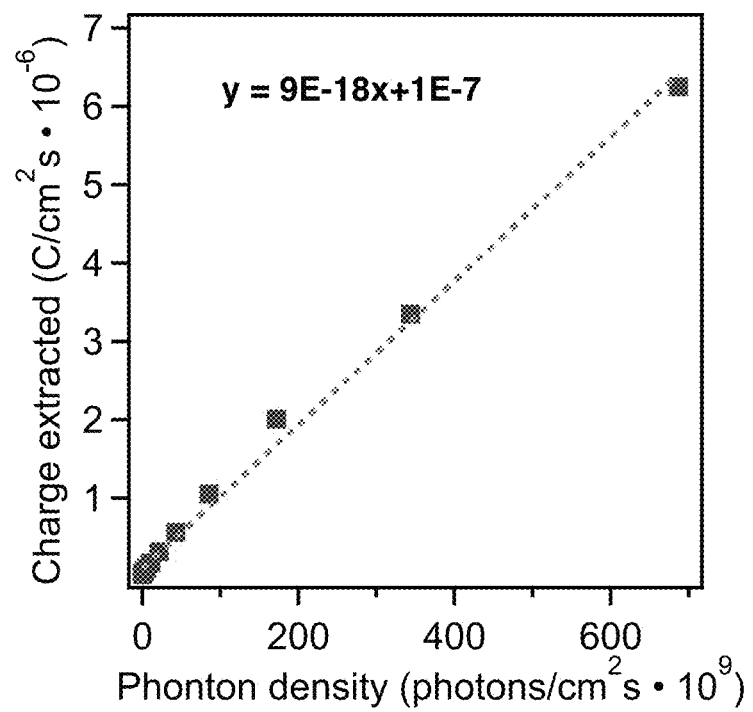
FIG. 7 is a graph depicting charge extracted as a function of photon density for a device according to embodiments of the present disclosure, and the dotted line shows the linear fit with a slope of $9 \times 10^{-18}$.

The device quantum efficiency is $1-e^{((-\mu*d))}$, the linear attenuation coefficient for the photon energy used (µ) is 473 cm$^{-1}$, and the device thickness (d) is 500 nm. Therefore, dividing (a) from (b) yields:

$$W_\pm = \frac{\text{photon density} * \text{photon energy} * \text{device quantum efficiency}}{\text{charge extracted}}$$
$$q =$$
$$\frac{1}{\text{slope}} * \text{photon energy} * \text{device quantum efficiency} * q = 4.46 \text{eV}$$

Where slope ($9*10^{-18}$) is obtained from linear fit in FIG. 1E (also see FIG. 7 for the linear fit), photon energy is 10910 eV and charge extracted is $2.73*10^{-8}$ C·cm$^{-2}$·s$^{-1}$. Several materials follow the Klein rule (see C. A. Klein, Bandgap Dependence and Related Features of Radiation Ionization Energies in Semiconductors. *J. Appl. Phys.* 39, 2029-2038 (1968), the entire content of which is incorporated herein by reference), which gives an estimate of the relationship between the ionization energy and bandgap of the material as: $W_+=2.8*E_g+E_{phonon}$, where $E_g$ is the energy bandgap (1.8 eV for Pb3) and $E_{phonon}$ is the phonon energy term (approximately 0.5 eV). Using the Klein rule, the value of $W_+$ for Pb3 is 5.54 eV. Here, the measured value (4.46 eV) is in the same range as the theoretically predicted value.

An important figure of merit is the detector's sensitivity (C $Gy_{air}^{-1} cm^{-3}$), which can be extracted from the slope of the linear region in the charge density-dosage dependent plot in FIG. 1F, and multiplied by the thickness. First, the photon flux is converted into an exposure dosage for air ($Gy_{air}$) by calculating the charge ionized in air with 10.91 keV X-ray energy (as discussed above). The X-ray signal subtracted by dark signal from the detector ($C_{on}$-$C_{off}$) is plotted in FIG. 1F as a function of incident X-ray dosages. It is observed that 2D RP device has comparable signal-to-noise level at high X-ray dosage to the Si diode, but shows a much lower detecting limit with distinguishable signal-to-noise ratio of $10^{-8}$ charge density (C $cm^{-2}$ $s^{-1}$) at low exposure dosage down to $10^{-5}$ $Gy_{air}$ $s^{-1}$. The slope of the 2D RP device is $1.39 \times 10^5$ C $Gy^{-1}$ $cm^{-2}$, about 2 times better than that of the silicon device. The sensitivity for the 2D RP device is therefore estimated to be in the range of 0.3 C $Gy_{air}^{-1} cm^{-3}$. The measured sensitivity value for the Si p-i-n diode is comparable to typical silicon diode performance as discussed herein, which validates the measured values. The sensitivity value for the 2D RP device is considerably higher than other reported sensitivity values for perovskite-based X-ray detectors (see Table 1 above providing a comparison with literature reported detectors). The thin film detectors according to embodiments of the present disclosure also offer better performance than the bulk crystal detectors operating in the X-ray regime. See S. Yakunin, M. Sytnyk, D. Kriegner, S. Shrestha, M. Richter, G. J. Matt, H. Azimi, C. J. Brabec, J. Stangl, M. V. Kovalenko, W. Heiss, Detection of X-ray photons by solution-processed lead halide perovskites. Nat. Photon. 9, 444 (2015), the entire content of which is incorporated herein by reference. With the bias-free, high-sensitivity device response towards X-ray exposure, the 2D RP devices according to embodiments of the present disclosure can be considered self-powered detectors.

Figure 2A:
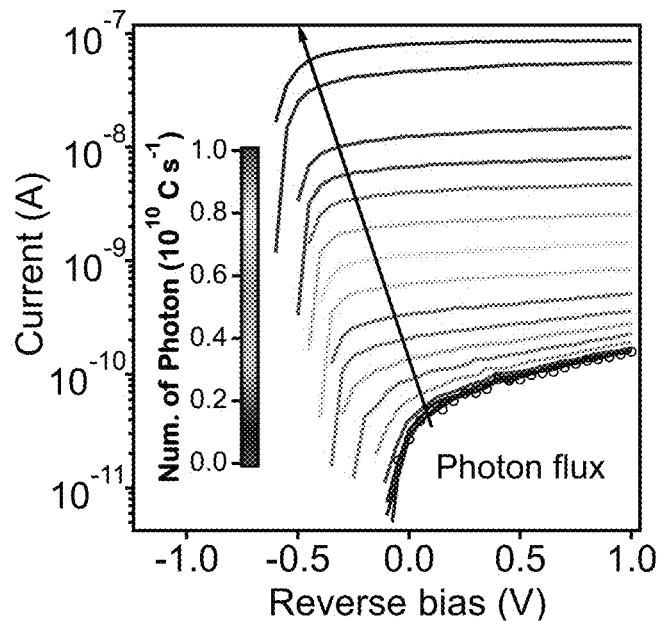
FIG. 2A is a graph of the power dependent J-V characteristics for a 2D RP thin film X-ray detector response with Pb3 as the absorbing layer (470 nm thickness) under various photon flux (where the different colors represent the varying photon flux as indicated in the legend) according to embodiments of the present disclosure.
Figure 2B:
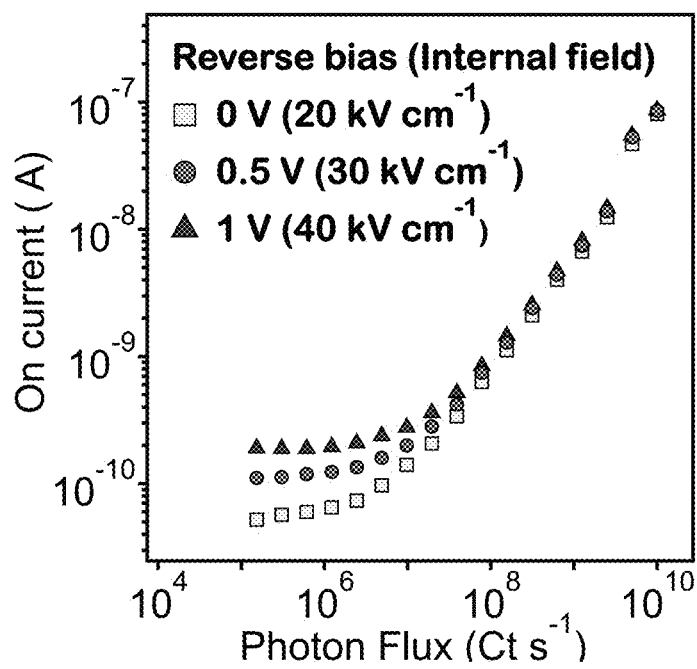
FIG. 2B is a graph of the on-current at various reverse bias (0V in square teal trace; 0.5V in circular lighter blue trace; and 1V in triangular darker blue trace) as a function of photon flux in unit of courts per second (Ct s$^{-1}$) for a 2D RP device according to embodiments of the present disclosure.
Figure 8:
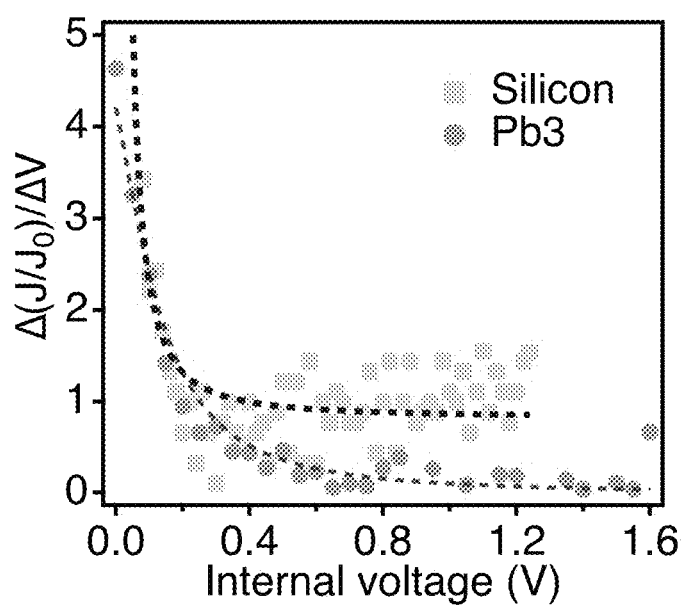
FIG. 8 is a graph comparing the J-V slope obtained by taking the first-order derivative from FIG. 2A as a function of internal field (V-Voc) for a 2D RP device according to embodiments of the present disclosure (red trace) and the values for a silicon diode (blue trace)

To better understand such superior detector performance, the power and field dependent J-V characteristics for the 2D RP devices were examined in greater detail, for example, in FIGS. 2A-B. The J-V curves under various X-ray photon flux are plotted in FIG. 2A. The J-V slope for a detector describes the field dependence of the photo-current collection. As can be seen, the Pb3 device signals systematically decrease with diminishing photon flux. Under high X-ray exposure, the J-V slope flattens in the moderate forward- to reverse-bias regime (See FIG. 8 for the derived J-V slopes) indicating a field-independent charge collection. See H. Tsai, R. Asadpour, J.-C. Blancon, C. C. Stoumpos, J. Even, P. M. Ajayan, M. G. Kanatzidis, M. A. Alam, A. D. Mohite, W. Nie, Design principles for electronic charge transport in solution-processed vertically stacked 2D perovskite quantum wells. Nat. Commun. 9, 2130 (2018), the entire content of which is incorporated herein by reference. The J-V slope for the Pb3 device decreases rapidly when the internal field increases, and remains low at higher voltage. This suggests a highly efficient carrier collection rate under X-ray exposure.

The Jx as a function of X-ray photon flux under various electrical fields is plotted in FIG. 2B. The X-ray photon flux dependent Jx is found to be nearly identical when the detector operates under different applied voltage (FIG. 2B). Both observations suggest a near ideal charge collection efficiency under X-ray exposure. Because of the large density of carriers generated by the strong X-ray absorption in Pb3, a significant built-in field is formed by quasi-fermi level splitting between p and n contacts, facilitating the subsequent charge collection. This is thus an intentional benefit of the thin film p-i-n junction design, where charges are collected by internal electrical field without the need of external fields. The field-independent charge collection holds at various X-ray irradiations (FIG. 2B), which leads to the observation of near identical Jx-X-ray flux curve under various fields. These results mean that Pb3 thin film detectors remain efficient at low dosage exposure.

Figure 2C:
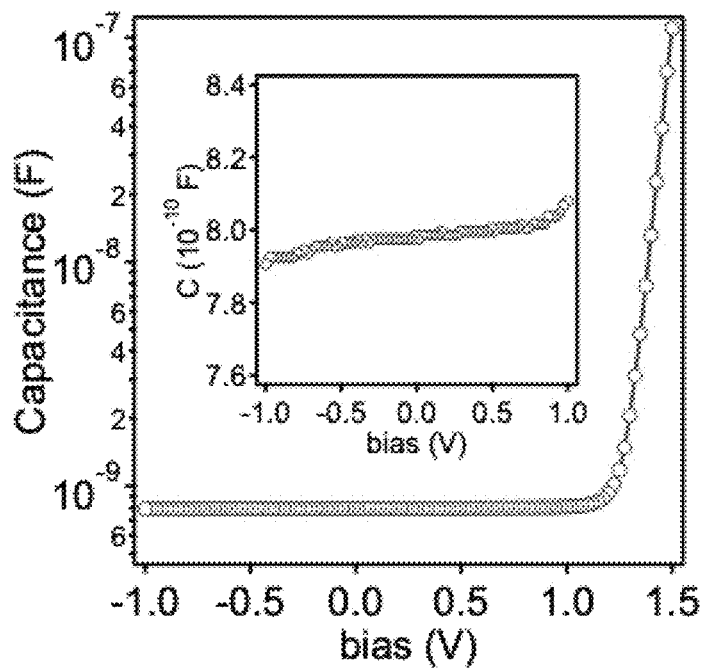
FIG. 2C is a capacitance-voltage curve for a 2D RP thin film device (470 nm) according to embodiments of the present disclosure, and the capacitance is normalized by its capacitance at 0 bias.

To validate, capacitance-voltage (C-V) measurements were used to probe the depletion junction for 2D RP thin film (470 nm) X-ray devices. FIG. 2C shows the normalized C (the capacitance by $C_0$ value at 0 bias) against the DC bias curve probed at an AC frequency of 100 kHz. From the plot, a flattened slope in −1 V to +0.9 V range is observed, indicating a negligible change in capacitance under external DC bias in this range. This is a classical signature of a fully depleted junction formation without the contribution of space charge in the intrinsic perovskite layer. See M. L. Lucia, J. L. Hernandez-Rojas, C. Leon, I. Mártil, Capacitance measurements of p-n junctions: depletion layer and diffusion capacitance contributions. Eur. J. Phys. 14, 86-89 (1993), the entire content of which is incorporated by reference. At forward bias, the capacitance value increase after the bias is higher than the flat band voltage. This is because of the charge recombination in the junction by DC current injection.

Figure 2D:
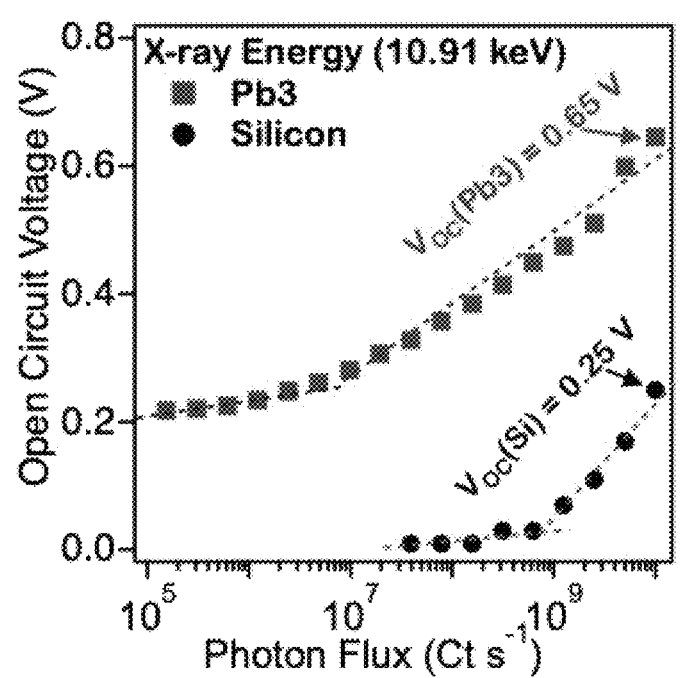
FIG. 2D is a graph of the open circuit voltage (Voc) as a function of normalized X-ray beam flux in log-scale for an X-ray energy of 10.91 keV for a 2D RP (470 nm) device (red trace) according to embodiments of the present disclosure and a silicon reference device (black trace)
Figure 2E:
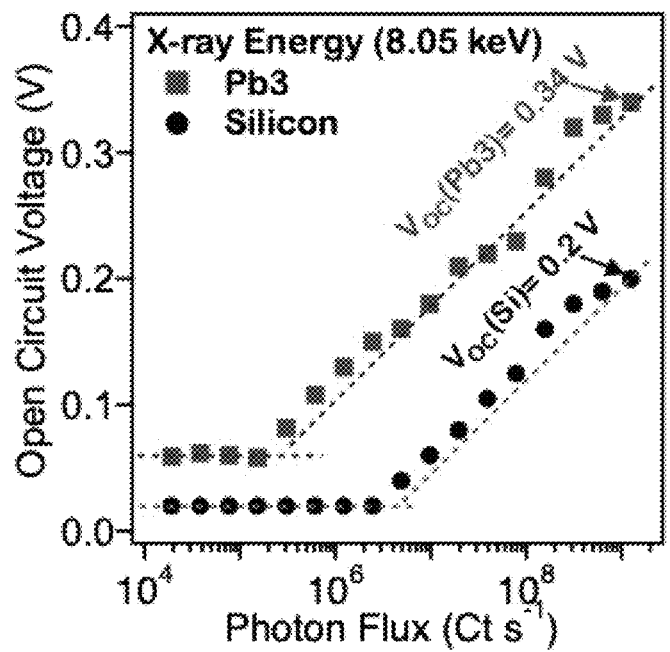
FIG. 2E is a graph of the open circuit voltage (Voc) as a function of normalized X-ray beam flux in log-scale for an X-ray energy of 8.05 keV for a 2D RP (470 nm) device (red trace) according to embodiments of the present disclosure and a silicon reference device (black trace)

The fact that the detector according to embodiments of the present disclosure produces high open circuit voltage (Voc=650 mV) due to high carrier density generation suggests using the generated voltage as an alternative detection parameter. To evaluate this feasibility, Voc values for the 2D RP and Si reference detectors are plotted as a function of X-ray photon flux under two different energies (FIGS. 2D-E). The range of the X-ray photon flux is estimated by the output current signal from the calibration silicon diode exposed under those two X-ray photon sources. The Voc is found to scale linearly with the photon flux in log scale. The detector was also tested under two different X-ray energies, and the same dependency in both cases was observed. The open circuit voltage generation in a photovoltaic device (see L. J. A. Koster, V. D. Mihailetchi, R. Ramaker, P. W. M. Blom, Light intensity dependence of open-circuit voltage of polymer:fullerene solar cells. Appl. Phys. Lett. 86, 123509 (2005), the entire content of which is incorporated herein by reference) was attributed to the quasi-fermi level splitting determined by the balance between carrier generated and recombination, and the value was found to be linearly proportional to the photon flux in log-scale. It can be described by the effective band gap ($E_{eff}$) and charge recombination (n) and is a function of temperature (T), as noted in the below formula (see R. A. Sinton, A. Cuevas, Contactless determination of current-voltage characteristics and minority-carrier lifetimes in semiconductors from quasi-steady-state photoconductance data. Appl. Phys. Lett. 69, 2510-2512 (1996), the entire content of which is incorporated herein by reference):

$$V_{OC} = \frac{k_B T}{q} \ln\left(\frac{(N_A + \Delta n)\Delta n}{n_i^2}\right)$$

In the above formula, $k_B T/q$ is the thermal voltage, NA is the doping concentration, $\Delta n$ is the excess carrier concentration, and $n_i$ is the intrinsic carrier concentration. During photovoltaic device operation, the photo generated carrier concentration is proportional to the incident light power, and the open circuit voltage is thus proportional to the In (power). A similar trend was observed in FIGS. 3D-E, where the Voc scales linearly with the log of the incident X-ray photon flux. Therefore, the X-ray generated open circuit voltage is also a charge density dependent term. By fitting the linear-log curve in FIG. 3D, the obtained slope is 0.046, corresponding to 2 $k_B T/q$ at room temperature; here $k_B$ is the Boltzmann constant, T is temperature, and q refers to elementary charge. This is a similar observation to a previous study which concluded that at lower light power, the 2D perovskite device's Voc versus log-light power plot yielded a linear fit slope of 2 $k_B T/q$ at room temperature. See H. Tsai, R. Asadpour, J.-C. Blancon, C. C. Stoumpos, J. Even, P. M. Ajayan, M. G. Kanatzidis, M. A. Alam, A. D. Mohite, W. Nie, Design principles for electronic charge transport in solution-processed vertically stacked 2D perovskite quantum wells. Nat. Commun. 9, 2130 (2018), the entire content of which is incorporated herein by reference. Such relation is concomitant to the observation in X-ray detectors, suggesting that the physical origin of the X-ray generated Voc is determined by the charge density as well.

Figure 2F:
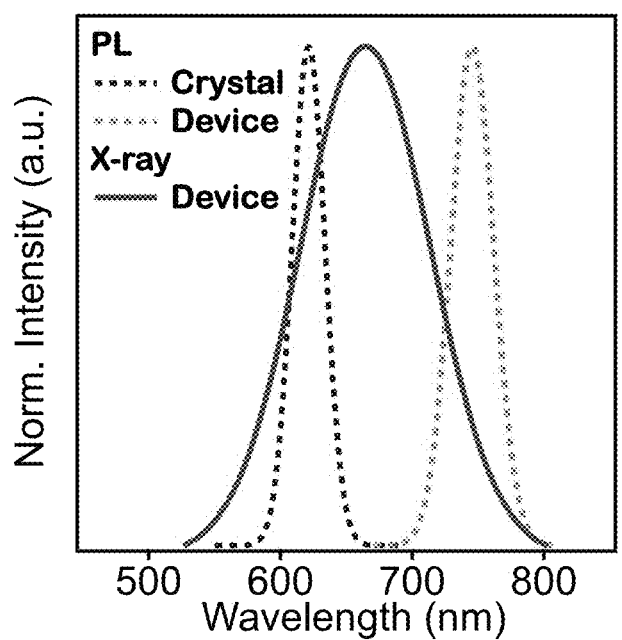
FIG. 2F is a graph comparing the photo emission spectra of a Pb3 thin film device excited by hard X-ray (red trace) to the photoluminescence spectra of a Pb3 thin film (green trace) and a Pb3 single crystal (blue trace) excited by laser (405 nm)
Figure 9A:
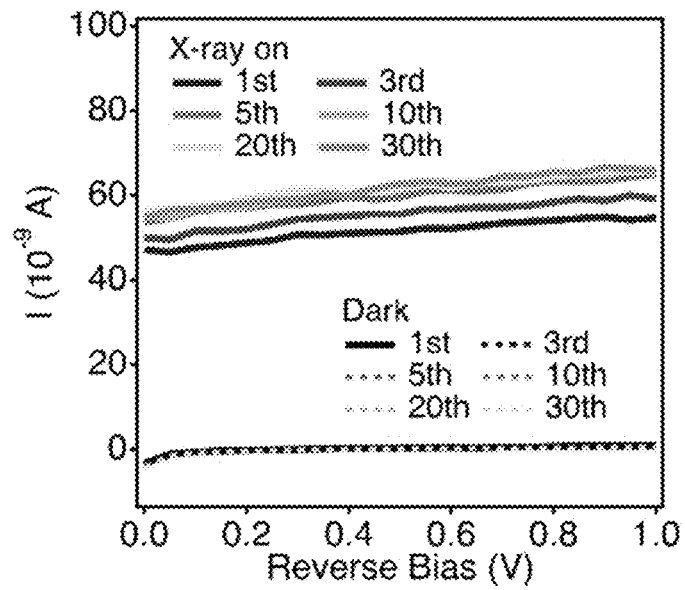
FIG. 9A is a graph depicting power dependent J-V characteristics for a Pb3/2D RP thin film X-ray detector device according to embodiments of the present disclosure after multiple X-ray exposure cycles (X-ray on: $1^{st}$ cycle brown trace; $3^{rd}$ cycle red trace; $5^{th}$ cycle dark orange trace; $10^{th}$ cycle light orange trace; $20^{th}$ cycle yellow trace; and $30^{th}$ cycle green trace; and Dark: $1^{st}$ cycle solid black trace; $3^{rd}$ cycle dark blue dotted trace; $5^{th}$ cycle medium blue dotted trace; $10^{th}$ cycle light blue dotted trace; $20^{th}$ cycle dark teal dotted trace; and $30^{th}$ cycle light teal dotted trace)
Figure 9B:
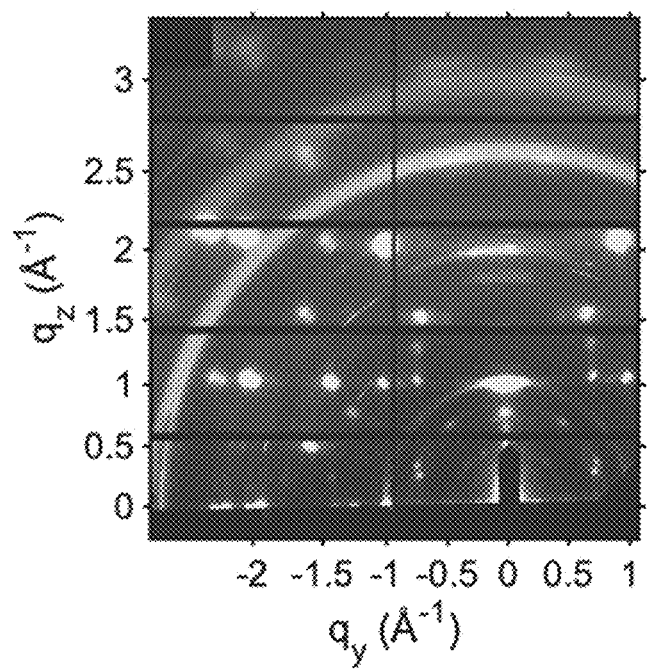
FIG. 9B is a synchrotron GIWAXS map for the Pb3 device of FIG. 9A before 30 scans, which showed no degradation after multiple X-ray exposures.
Figure 9C:
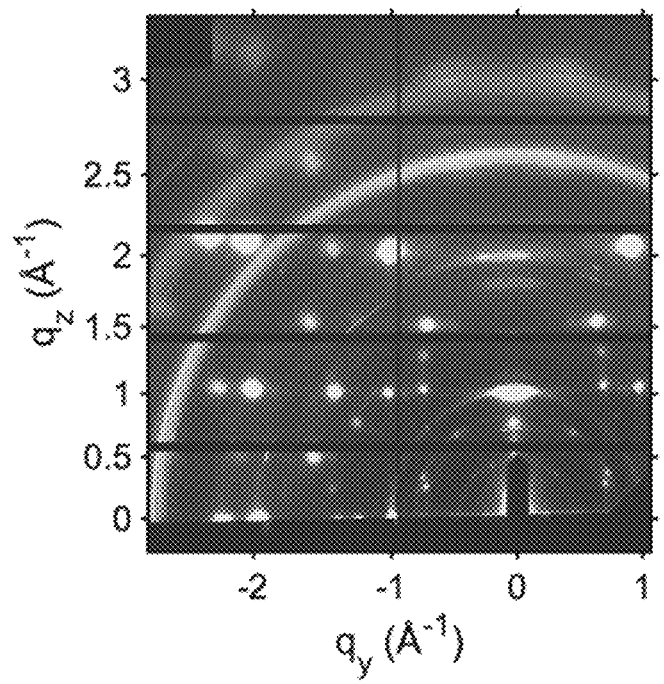
FIG. 9C is a synchrotron GIWAXS map for the Pb3 device of FIG. 9A after 30 scans, which showed no degradation after multiple X-ray exposures.

The X-ray luminescence spectra of the Pb3 thin film (FIG. 2F, red) was measured by probing the visible emission signal from the Pb3 thin film under X-ray excitation. This measurement reveals the ionized charge recombination pathway (radiative recombination) that helps to gain deeper insight to the detector operational mechanism. The intrinsic emission spectra for the Pb3 single crystal and thin films by photoluminescence (PL) are compared in the same plot. As shown, the Pb3 thin film exhibits a broad spectrum upon X-ray excitation, covering energies from 2 eV to 1.66 eV. The thin film was shown to be stable after this measurement, as the crystalline structure was checked with a GIWAXS map (FIG. 9) that excludes the degradation effect. From the literature, it is known that a 2D RP thin film has two PL emission features at both high-energy (peaks at 2 eV) and low-energy states (peaks at 1.7 eV). The high energy feature is observed from the single crystal (bulk states), whereas the low energy emission state dominates in the thin film; and the latter facilitates the carrier dissociation and prevents charge recombination. See J. C. Blancon, H. Tsai, W. Nie, C. C. Stoumpos, L. Pedesseau, C. Katan, M. Kepenekian, C. M. M. Soe, K. Appavoo, M. Y. Sfeir, S. Tretiak, P. M. Ajayan, M. G. Kanatzidis, J. Even, J. J. Crochet, A. D. Mohite, Extremely efficient internal exciton dissociation through edge states in layered 2D perovskites. Science 355, 1288 (2017), the entire content of which is incorporated herein by reference.

When comparing the X-ray luminescence spectra of the Pb3 thin film to the PL of the film (green) and single crystal flakes (blue), the emission originates from ionized charge recombination from both low-energy and high-energy states. This was not observed in the PL spectra when excited by low energy lasers. It can therefore be concluded that when high energy X-ray excites the material, the charges are avalanched and ionized at a much higher energy (high density of hot carriers), and transported through both high energy and low energy states to be collected directly, yielding electrical signal. This is distinctive to the detector operating under visible light where hot-carrier loss is not avoidable. Such a process thus benefits a high X-ray induced electrical current signal and high Voc generation without thermal loss through a hot-carrier cooling process in the Pb3 device, which demonstrates outstanding performance in X-ray detection mode as opposed to visible light detection. See FIGS. 10-12.

To summarize, the linear dependence observed in FIGS. 2D-E suggests Voc as a promising detecting mechanism that can advance a simplified external circuit design for signal measurements. Notably, the 2D RP devices according to embodiments of the present disclosure show distinguishable Voc at different X-ray energies, which could thus be a sensitive parameter to distinguish the energy through different numbers of ionized carriers in the semiconductor. See R. L. Owen, J. M. Holton, C. Schulze-Briese, E. F. Garman, Determination of X-ray flux using silicon pin diodes. J. Synchrotron Radiat. 16, 143-151 (2009), and E. M. Gullikson, R. Korde, L. R. Canfield, R. E. Vest, Stable silicon photodiodes for absolute intensity measurements in the VUV and soft X-ray regions. J. Electron. Spectrosc. 80, 313-316 (1996), the entire contents of which are incorporated by reference.

One benefit of using solid-state X-ray detectors is their fast response time to X-ray exposure. However, the reported state-of-art X-ray detector based on perovskite materials have response times in the second to milli-second time regime because of the presence of hysteresis effects. See W. Wei, Y. Zhang, Q. Xu, H. Wei, Y. Fang, Q. Wang, Y. Deng, T. Li, A. Gruverman, L. Cao, J. Huang, Monolithic integration of hybrid perovskite single crystals with heterogenous substrate for highly sensitive X-ray imaging. Nat. Photon. 11, 315 (2017); S. Shrestha, R. Fischer, G. J. Matt, P. Feldner, T. Michel, A. Osvet, I. Levchuk, B. Merle, S. Golkar, H. Chen, S. F. Tedde, O. Schmidt, R. Hock, M. Rührig, M. Göken, W. Heiss, G. Anton, C. J. Brabec, High-performance direct conversion X-ray detectors based on sintered hybrid lead triiodide perovskite wafers. Nat. Photon. 11, 436 (2017); W. Pan, H. Wu, J. Luo, Z. Deng, C. Ge, C. Chen, X. Jiang, W.-J. Yin, G. Niu, L. Zhu, L. Yin, Y. Zhou, Q. Xie, X. Ke, M. Sui, J. Tang, Cs2AgBiBr6 single-crystal X-ray detectors with a low detection limit. Nat. Photon. 11, 726-732 (2017); Y. C. Kim, K. H. Kim, D.-Y. Son, D.-N. Jeong, J.-Y. Seo, Y. S. Choi, I. T. Han, S. Y. Lee, N.-G. Park, Printable organometallic perovskite enables large-area, low-dose X-ray imaging. Nature 550, 87 (2017); H. Wei, Y. Fang, P. Mulligan, W. Chuirazzi, H.-H. Fang, C. Wang, B. R. Ecker, Y. Gao, M. A. Loi, L. Cao, J. Huang, Sensitive X-ray detectors made of methylammonium lead tribromide perovskite single crystals. Nat. Photon. 10, 333 (2016); and S. Yakunin, M. Sytnyk, D. Kriegner, S. Shrestha, M. Richter, G. J. Matt, H. Azimi, C. J. Brabec, J. Stangl, M. V. Kovalenko, W. Heiss, Detection of X-ray photons by solution-processed lead halide perovskites. Nat. Photon. 9, 444 (2015), the entire contents of all of which are incorporated herein by reference.

Figure 3A:
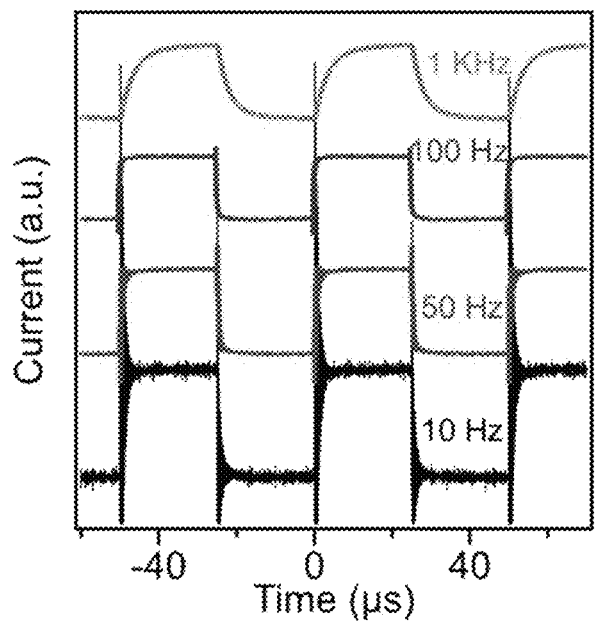
FIG. 3A is a graph of the transient photocurrent response of a device with various applied resistance (1 KHz green trace; 100 Hz blue trace; 50 Hz red trace; 10 Hz black trace)
Figure 3B:
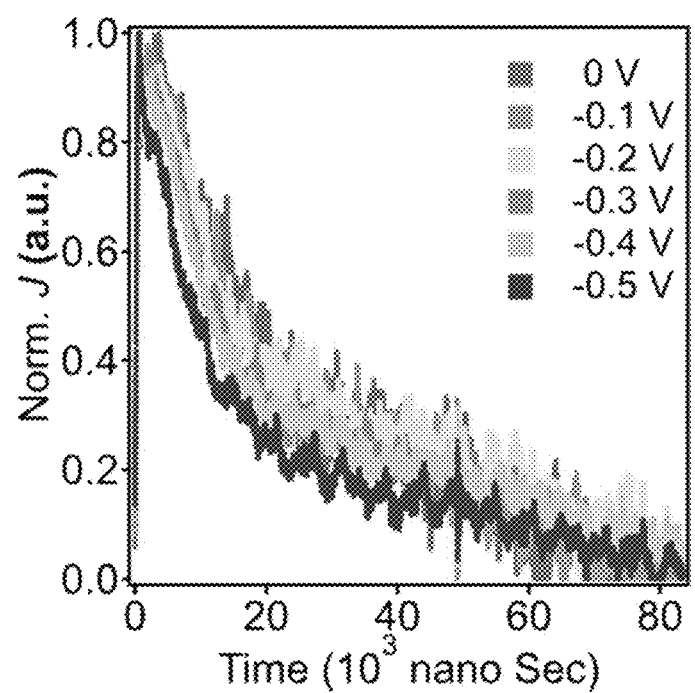
FIG. 3B is a graph of the time-resolved photo conductivity of a thin film device according to embodiments of the present disclosure under pulsed laser excitation (375 nm) and under various biases (0 V red trace; –0.1 V orange trace; –0.2 V yellow trace; –0.3 V green trace; –0.4 V light blue trace; –0.5 V dark blue trace)
Figure 3C:
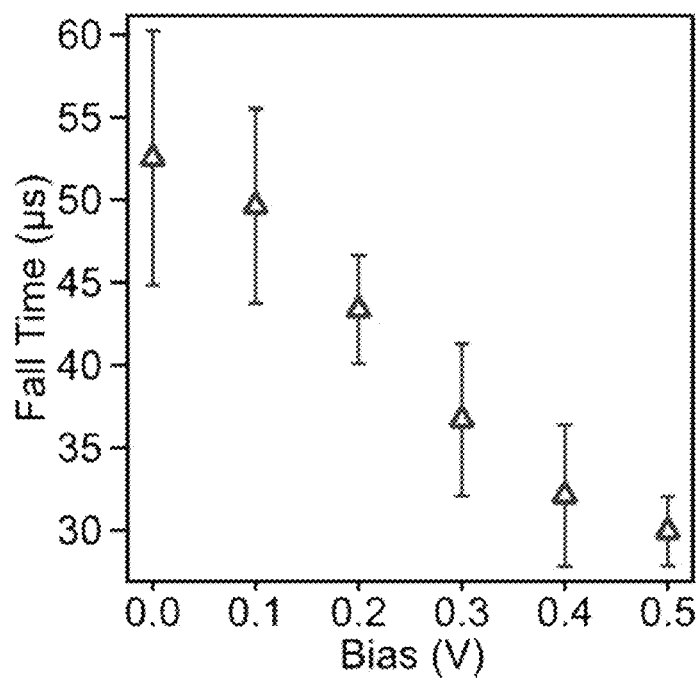
FIG. 3C is a graph of device signal fall time extracted from FIG. 3B under various biases.

In the 2D RP devices according to embodiments of the present disclosure, the thin film design with large built-in field should facilitate the fast extraction of X-ray generated carriers, and presents another advantage of such a device design. To test the detector's temporal response with various load resistors, visible light was used as an excitation source (FIG. 3A). The rise and fall times are found in the range of about 1 to about 10 μs, and get slower as the load resistor increases. This indicates the detectors' temporal response is capped by the circuit time constant, and the real response from the material is much faster. The time resolved photocurrent under fast laser excitation was therefore further investigated, and the photocurrent amplitude was kept comparable to the X-ray induced current density (0.1 mA cm$^{-2}$). The rise time of the device under pulsed laser is <500 ns, and the fall time is in the range of 20-60-micron seconds (FIGS. 3B-C), and external applied bias speeds up the detector response, as expected. This is much faster than the literature reported detector using bulk film or crystal as the absorber, and can be attributed the p-i-n junction design. It is also related to the greatly reduced defects in the highly crystalline 2D RP perovskite thin film that suppresses ion migration induced current hysteresis (FIG. 6).

Figure 3D:
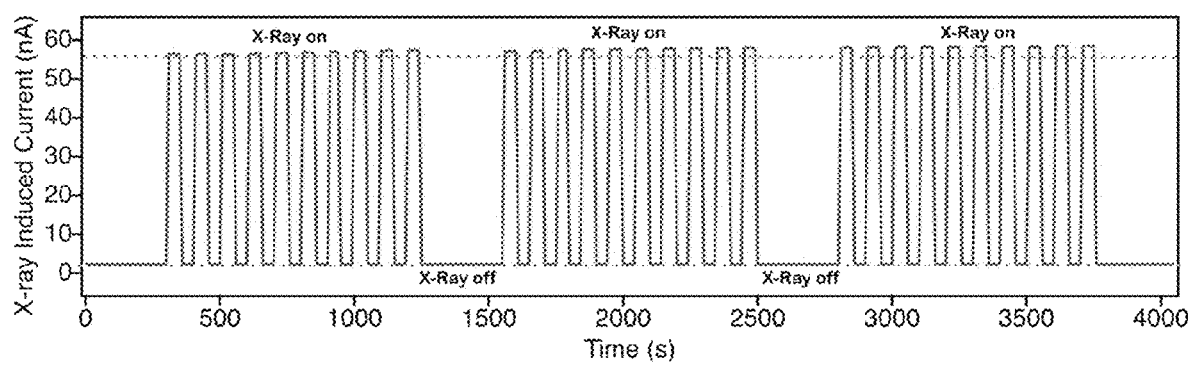
FIG. 3D is a graph depicting the results of a stability test of a thin-film detector according to embodiments of the present disclosure operating under continuous hard X-ray (10.91 keV) exposure at a short circuit condition.

The primary photocurrent feature of the thin film detector according to embodiments of the present disclosure allows the device to efficiently operate without bias. Perovskites are generally unstable under high voltage. However, high voltage operation is required in a bulk detector with large volume, which drastically reduces the device's operational lifetime. Here, the thin film device performance is stabilized for at least 30 cycles of voltage scans and X-ray exposures (FIG. 3D). The dark and X-ray current-voltage characteristics were scanned 30 times, with each dark and exposure time being 300 seconds (See FIG. 9A for J-V curves). The dark current remains the same after the 30 scans, suggesting the junction remains robust after voltage cycling. Interestingly, the device first exhibited an increase in X-ray photo current while the dark current remained unchanged. The crystalline structure was also examined by Grazing incident wide angle X-ray scattering (GIWAXS) on the thin film before and after the stability tests. The GIWAXS patterns remained identical (FIGS. 9B-C), which suggests that the thin film is stable under both bias and X-ray exposure.

$(BA)_2(MA)_2Pb_3I_{10}$ and $(BA)_2(MA)_4Pb_5I_{16}$ Devices

2D RP Material Preparation

Figure 16:
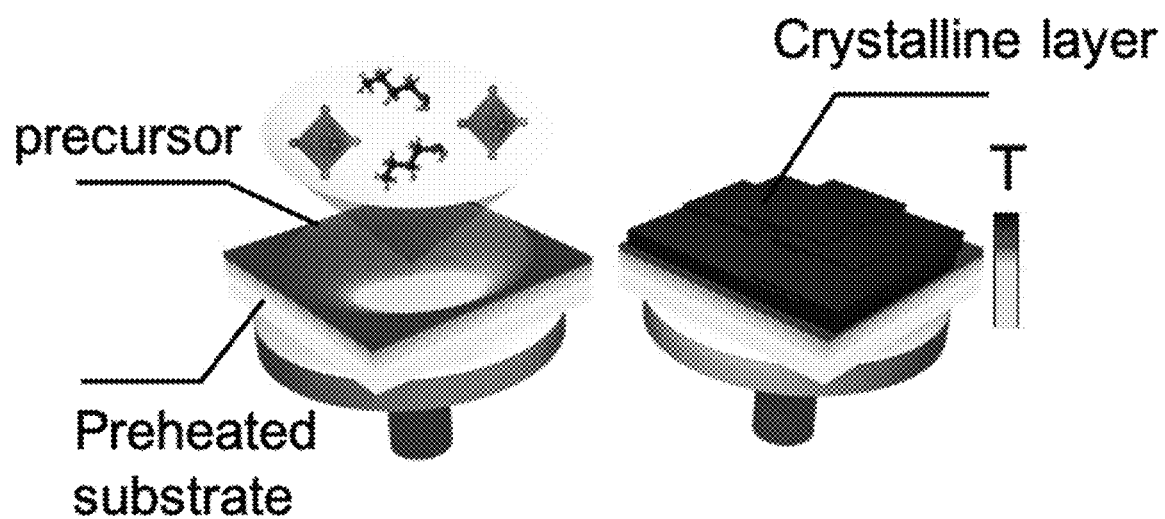
FIG. 16 is a schematic depicting a thin film fabrication method according to embodiments of the present disclosure.

As shown generally in FIG. 16, Quasi-2D precursors are prepared by mixing lead iodide (99.999% trace metal basis) with methylammonium iodide (>99%, anhydrous) and n-Butylammonium iodide (Sigma-Aldrich) in molar ratios of 1:1:0 (referred to herein as "3D"), 3:2:2 ($(BA)_2(MA)_2Pb_3I_{10}$ referred to herein as "<N3>") and 5:4:2 ($(BA)_2(MA)_4Pb_5I_{16}$ referred to herein as "<N5>"). The powder is dissolved in N,N-Dimethylformamide (99.8% anhydrous), the molar concentration is varied from 0.5 M, 1 M, 2 M to 3.3 M to fabricate quasi-2D perovskite layers at thicknesses of 1 μm (at 0.5 M concentration), 3 μm (at 1 M concentration), 5 μm (at 2 M concentration) and 10 μm (3.3 M concentration). The solution is heated at 110° C. to dissolve the powder, and is heated at 150° C. before coating. All the chemicals were purchased from Sigma-Aldrich and used as received.

Figure 16A:
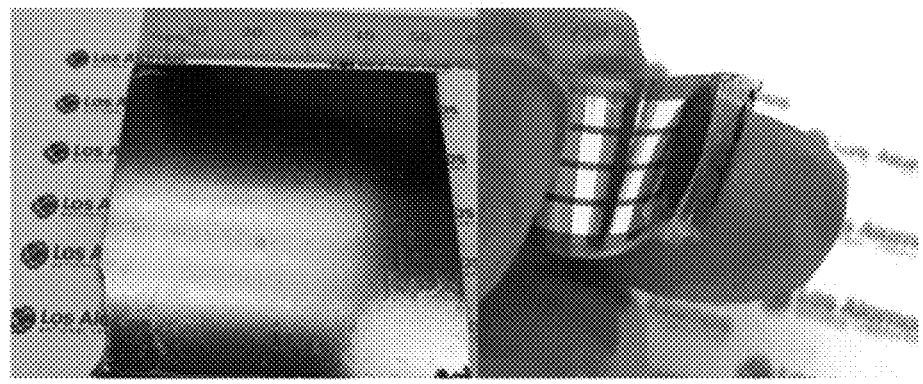
FIG. 16A is a photograph of a crystalline <N3> layer covering a 5 cm by 5 cm substrate.

FIG. 16 is a schematic depicting the thin film fabrication method, and this method can be used with rigid substrates on a large scale, as illustrated in FIG. 16A (left), as well as with flexible conducting substrates, as shown in FIG. 16A (right).

Device Fabrication and Testing

Rigid substrates with indium tin oxide or gold strips (for single pixel device), and Kapton substrates coated with gold are rinsed using isopropyl alcohol and dried by nitrogen blowing. After being treated by oxygen plasma for 3 minutes, the substrates are placed in argon filled gloveboxes for device fabrication. A hole conducting layer (p-type contact layer) of Poly[bis(4-phenyl)(2,4,6-trimethylphenyl)amine (PTAA) is formed by spin coating the PTAA solution (10 mg/ml in chlorobenzene) on the precleaned substrates at 1500 rpm for 40 seconds, followed by 150° C. baking for 30 minutes. The PTAA surface is further treated by oxygen plasma for 2 minutes prior to perovskite layer coating. The PTAA/substrates are heated to 100° C. to about 160° C. on a hot plate in the glovebox for about 1 minute, and are quickly transferred to a spin coater (room temperature) where the spinning starts immediately at 5 k rpm without ramping. The coated substrates are further annealed at 70° C. for about 1 hour for solvent removal.

After the perovskite layer coating, an electron conducting layer (n-type contact layer) of fullerene and bathocuproine (BCP) are deposited by thermal evaporation. Top metallization is completed by gold deposition through a shadow mask via E-beam evaporation.

Grazing-Incidence Wide-Angle X-Ray Scattering (GI-WAXS)

Grazing-Incidence Wide-Angle X-Ray Scattering (GI-WAXS) measurements conducted at beamline 8-ID-E22 of the Advanced Photon Source used an x-ray beam with a photon energy of 10.9 keV, and a Pilatus 1M pixel array detector positioned 217 mm from the sample in a vacuum environment. The beam dimensions 200 μm H×10 μm V result in an x-ray footprint of 0.02 mm by 0.57 mm at the incident angle of 2°. For the lateral scans in FIG. 16G, the horizontal beam size was reduced to 10 μm, and the sample was translated 40 μm between 3-second exposures.

Photoluminescence and Scanning Photocurrent Microscope Characterization

A CW laser diode (515 nm) is coupled to an objective lens (50X) and focused to the surface of the sample, and the photoluminescence is coupled through the same objective lens and reflected to spectrometer. The PL spectra are recorded by the spectrometer. The laser power is cut down by neutral density filters to 400 mW/cm2. The perovskite thin film or device is mounted on a piezo electric stage to translate the sample along the X and Y directions with respect to the laser spot, and a PL spectrum or a photocurrent amplitude is recorded at each position. A spatially resolved map can thus be obtained.

According to the above methods and protocols, a perovskite precursor was made by mixing $PbI_2$ and MAI powders in anhydrous N,N-dimethylformamide (DMF) to fabricate the "3D" $MAPbI_3$ films. To engineer the 2D precursor, BAI is incorporated in the powder mixture (with the $PbI_2$ and MAI powders) in an amount sufficient to yield the chemical formulas of $(BA)_2(MA)_2Pb_3I_{10}$ ("<N3>") and $(BA)_2(MA)_4Pb_5I_{16}$ ("<N5>"). The hot-casting approach was used (i.e., a modified spin casting method) to deposit a thick film. Details of the hot-casting approach are found in Nie, W. et al., "High-efficiency solution-processed perovskite solar cells with millimeterscale grains," *Science* 347, 522, (2015); Tsai, H. et al., "High-efficiency two-dimensional Ruddlesden—Popper perovskite solar cells," *Nature* 536, 312-316, (2016); Nie, W. et al., "Critical Role of Interface and Crystallinity on the Performance and Photostability of Perovskite Solar Cell on Nickel Oxide," *Advanced Materials* 30, 1703879, (2018); and Tsai, H. et al., "Light-induced lattice expansion leads to high-efficiency perovskite solar cells," *Science* 360, 67, (2018), the entire contents of all of which are incorporated herein by reference. A photo of the resulting <N3> thick film covering a 5 cm by 5 cm glass substrate is shown in FIG. 16A. In the hot-casting process, the substrate was heated to 160° C. prior to casting the perovskite solution. In addition, the same method can be employed for flexible device fabrication on Kapton substrates.

Figure 16B:
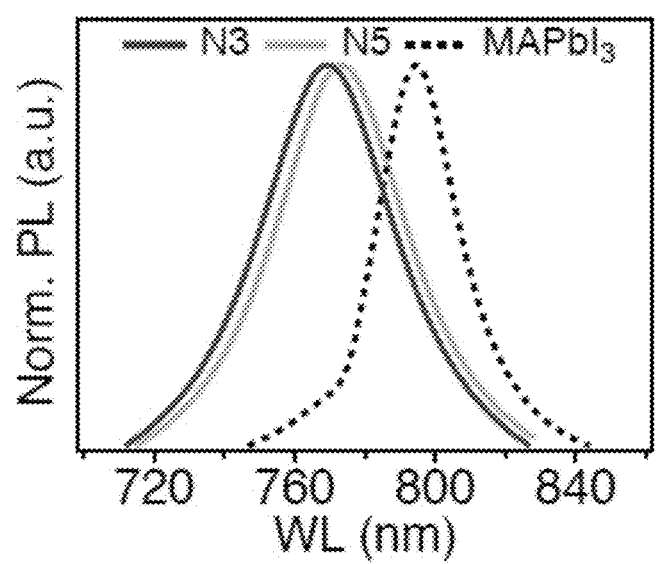
FIG. 16B is a graph comparing the photoluminescence spectra for <N3> (red), <N5> (teal) and MAPbI$_3$ (dotted black) perovskites fabricated by a hot-casting method.

FIG. 16B is the photoluminescence (PL) spectra for the 3D and quasi-2D films (i.e., <N3> and <N5>). As can be seen, the PL peak position for the 3D film is 790 nm while the peaks for the <N3> and <N5> films shift to 769 nm and 772 nm, respectively, indicating the 2D perovskite structure formation. The PL peak positions are at lower energies than those from the pure phase 2D single crystals, indicating that the layers are composed of quasi-2D structures where different n-numbered phases exist.

Figure 16C:
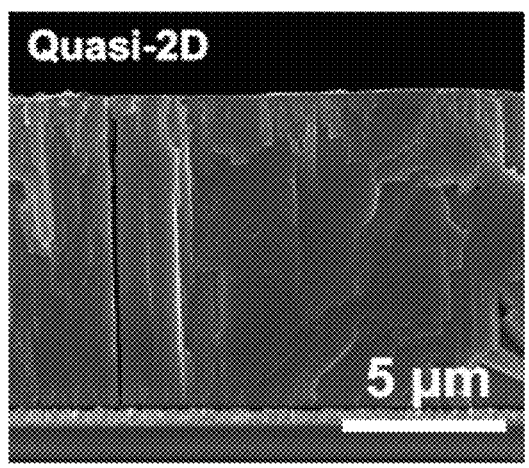
FIG. 16C is a cross-sectional scanning electron microscope (SEM) image of an <N3> perovskite layer according to embodiments of the present disclosure.
Figure 16D:
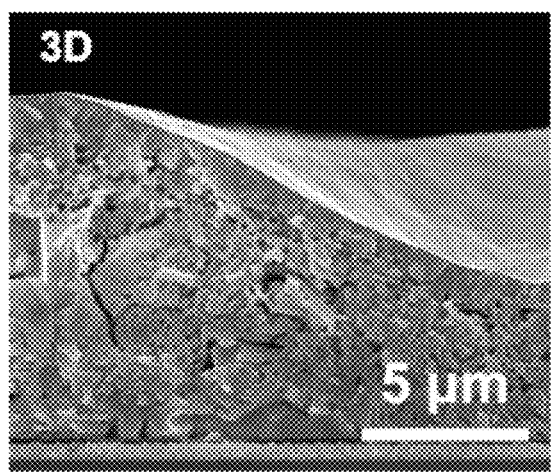
FIG. 16D is a cross-sectional SEM image of a MAPbI$_3$ perovskite layer.
Figure 16E:
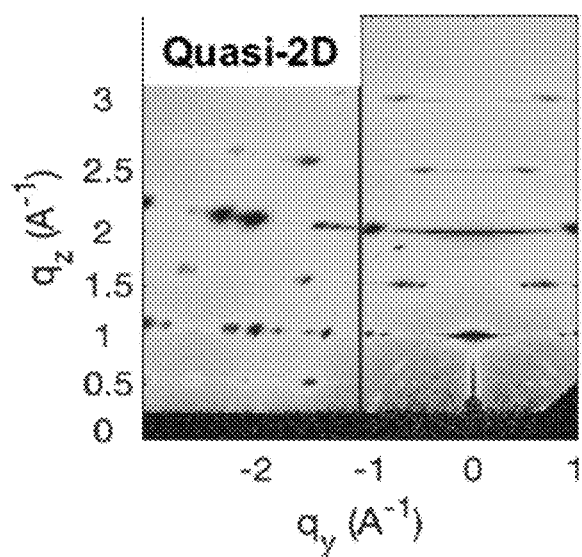
FIG. 16E is a GIWAXS map of an <N3> perovskite layer according to embodiments of the present disclosure.
Figure 16F:
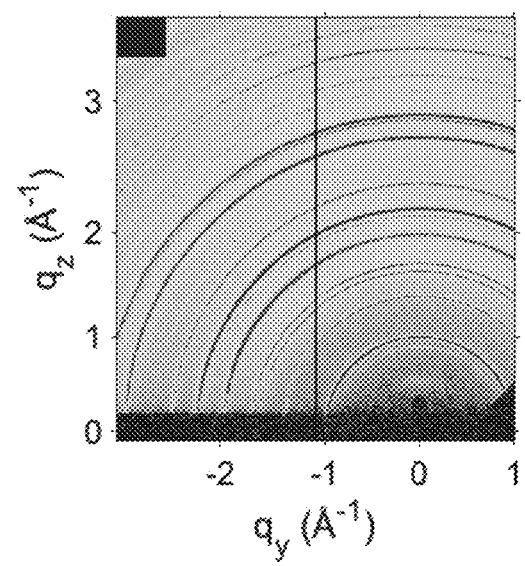
FIG. 16F is a GIWAXS map of a MAPbI$_3$ perovskite layer.

Cross-sectional scanning electron microscope (SEM) and grazing incidence-wide angle X-ray scattering (GIWAXS) are employed for film quality characterization, and are shown in FIG. 16C-H. FIG. 16C shows the SEM image of the <N3> film, and as can be seen, the film is compact and uniform with large crystal grains extending across the entire layer thickness of 10 μm. In sharp contrast, the 3D thick film comprises many 2-300 nm small crystal grains, as shown in FIG. 16D. Noticeably, the 3D film fabricated by the hot-casting method has large thickness variations between 4.7 to 10 μm. The GIWAXS of the <N3> film (FIG. 16E) has discrete reflection features corresponding to a high degree of crystallinity, and the (111) plane orients predominately along the out-of-plane direction. In contrast, the GIWAXS for the 3D MAPbI$_3$ film (FIG. 16F) exhibits isotropic rings.

Figure 16G:
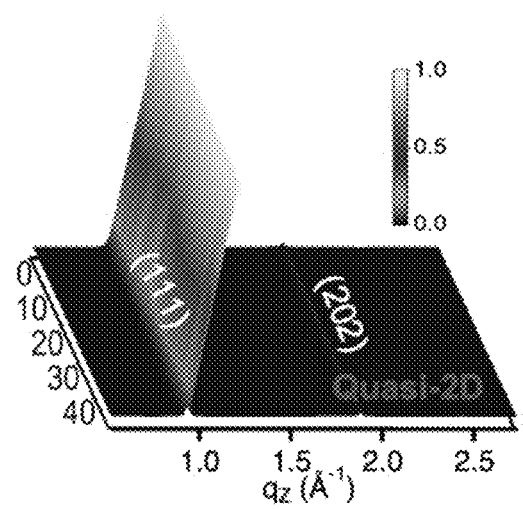
FIG. 16G is the line-cut profile extracted from the GIWAXS map of FIG. 16E when the X-ray beam is scanned laterally across the thin film.
Figure 16H:
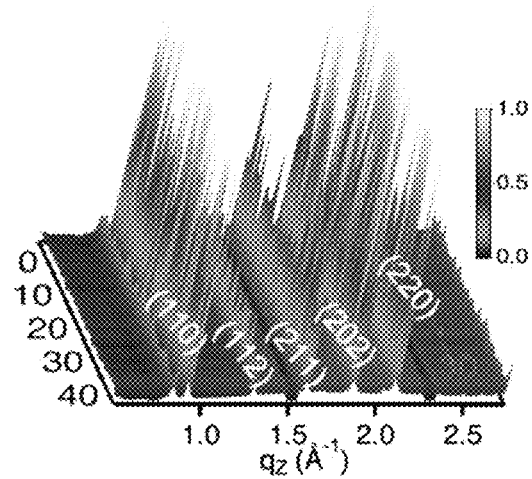
FIG. 16H is the line-cut profile extracted from the GIWAXS map of FIG. 16F when the X-ray beam is scanned laterally across the thin film.

In order to understand the film homogeneity, the GIWAXS was scanned laterally across the sample over 2 mm. The normalized line-cut profiles are plotted with the scan numbers in FIG. 16G-H for the <N3> and 3D films. In FIG. 16G, the peak intensities of the peaks for the (111) and (202) planes in the <N3> film are found to be generally invariant across all scans, whereas the relative peak intensities for the 3D sample vary drastically (FIG. 16H).

As can be seen from this data, the quasi-2D films (<N3> and <N5>) have large crystalline features with high uniformity across a large area, whereas the 3D film has a substantial number of small crystalline domains leading to a large variation in its X-ray scattering patterns. These results suggest that the cation engineering coupled with the hot-casting method is particularly suitable for depositing thick, crystalline, uniform layers. Without being bound by any particular theory, it is believed that the incorporation of BAI in the perovskite precursor leads to an intermediate phase that slowly release PbI$_2$ when the solvent evaporates, allowing for high quality 2D perovskite crystal growth. Here, a highly concentrated solution is employed to achieve the desirable layer thickness, and a precursor containing BAI can slow down the nucleation process to facilitate large crystalline grain formation. In contrast, the 3D precursor contains a large density of nucleation seeds, which promotes small grain growth.

Figure 16I:
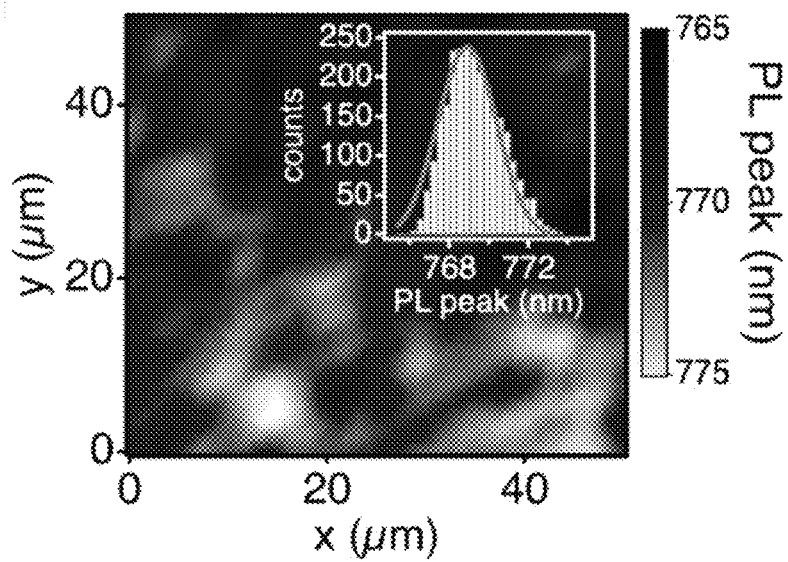
FIG. 16I is a spatially resolved photoluminescence peak position map for a <N3> film according to embodiments of the present disclosure, and the peak position distribution histogram is plotted in the inset.

To assess and characterize uniformity of the <N3> layer, spatially resolved photoluminescence (PL) peak position maps (FIG. 16I) and PL height maps were used. The laser is focused to about 1 to about 2 μm, and is scanned across a 50 μm by 50 μm area. The PL peak position analysis is shown in FIG. 16I. The PL peak positions are centered at 769±3 nm (FIG. 16I inset) and are narrowly distributed across the probing area. The PL map results suggest that the existing different n-numbered quasi-2D phases are well-mixed within the crystalline grains below the PL map's resolution.

While certain exemplary embodiments of the present disclosure have been illustrated and described, those of ordinary skill in the art will recognize that various changes and modifications can be made to the described embodiments without departing from the spirit and scope of the present invention, and equivalents thereof, as defined in the claims that follow this description. For example, although certain components may have been described in the singular, i.e., "a" cation, "an" anion, and the like, one or more of these components in any combination can be used according to the present disclosure.

Also, although certain embodiments have been described as "comprising" or "including" the specified components, embodiments "consisting essentially of" or "consisting of" the listed components are also within the scope of this disclosure. For example, while embodiments of the present invention are described as comprising a p-i-n architecture comprising a p-type contact layer, an n-type contact layer, and an intrinsic layer, embodiments consisting essentially of or consisting of these components are also within the scope of this disclosure. Accordingly, a p-i-n architecture may consist essentially of a p-type contact layer, an n-type contact layer, and an intrinsic layer. In this context, "consisting essentially of" means that any additional components will not materially affect the X-ray detection performance of the p-i-n architecture or detector employing the p-i-n architecture.

As used herein, unless otherwise expressly specified, all numbers such as those expressing values, ranges, amounts or percentages may be read as if prefaced by the word "about," even if the term does not expressly appear. Further, the word "about" is used as a term of approximation, and not as a term of degree, and reflects the penumbra of variation associated with measurement, significant figures, and interchangeability, all as understood by a person having ordinary skill in the art to which this disclosure pertains. Any numerical range recited herein is intended to include all sub-ranges subsumed therein. Plural encompasses singular and vice versa. For example, while the present disclosure may describe "a" cation or "an" anion, a mixture of such materials or ligands can be used. When ranges are given, any endpoints of those ranges and/or numbers within those ranges can be combined within the scope of the present disclosure. The terms "including" and like terms mean "including but not limited to," unless specified to the contrary. Further, as used herein, the term "substantially" is used as a term of approximation and not as a term of degree, and is intended to account for normal variations and deviations in the measurement or assessment of various parameters of the complexes and compositions (e.g., in the description of physical or chemical properties of various components and in the description of amounts of various components).

Notwithstanding that the numerical ranges and parameters set forth herein may be approximations, numerical values set forth in the Examples are reported as precisely as is practical. Any numerical value, however, inherently contains certain errors necessarily resulting from the standard variation found in their respective testing measurements. The word "comprising" and variations thereof as used in this description and in the claims do not limit the disclosure to exclude any variants or additions.

What is claimed is:

1. A radiation detector, comprising:
   a p-i-n diode, comprising:
   a p-type contact layer;
   an n-type contact layer; and
   an intrinsic layer between the p-type contact layer and the n-type contact layer, the intrinsic layer comprising a thin film comprising a highly crystalline 2D layered perovskite material represented by Formula 1A:

$$A_2B_{n-1}M_nX_{3n+1} \qquad \text{Formula 1A}$$

wherein, in Formula 1A, A is a first organic or inorganic cation, B is a second organic or inorganic cation, M is a metal, X is an anion, and n is an integer greater than or equal to 1.

2. The radiation detector of claim 1, further comprising a conducting substrate and a top electrode.

3. The radiation detector of claim 2, wherein the p-type contact layer is on the conducting substrate, and the top electrode is on the n-type contact layer.

4. The radiation detector of claim 2, wherein the top electrode is gold.

5. The radiation detector of claim 1, wherein the thin film of the intrinsic layer has a thickness in the range of 0.1 μm-100 μm.

6. The radiation detector of claim 1, wherein the radiation detector generates an open circuit voltage (Voc) of about 400 mV to about 800 mV under X-ray exposure.

7. The radiation detector of claim 1, wherein the radiation detector has a detecting photon density limit on the order of $10^8$ Ct s$^{-1}$cm$^{-2}$.

8. The radiation detector of claim 1, wherein the radiation detector has a volume sensitivity of 0.1 C Gy$_{air}^{-1}$cm$^{-3}$ to about 0.9 C Gy$_{air}^{-1}$cm$^{-3}$.

9. The radiation detector according to claim 1, wherein the radiation detector is self-powered.

10. The radiation detector according to claim 1, wherein the detector is capable of operation without the application of bias.

11. The radiation detector according to claim 1, wherein under pulsed laser the radiation detector has a rise time of less than 500 ns and a fall time in the range of 20-60 microseconds.

12. The radiation detector according to claim 1, wherein A comprises a primary, secondary, or tertiary aliphatic alkylammonium cation or a primary, secondary, or tertiary aromatic alkylammonium cation.

13. The radiation detector according to claim 1, wherein M is a main group metal.

14. The radiation detector according to claim 1, wherein B comprises a primary, secondary, or tertiary aliphatic alkylammonium cation or a primary, secondary, or tertiary aromatic alkylammonium cation.

15. The radiation detector according to claim 1, wherein the highly crystalline 2D layered perovskite material comprises a perovskite represented by Formula 2A:

$$(BA)_2(MA)_{n-1}(Pb)_n(I)_{3n+1}. \qquad \text{Formula 2A}$$

wherein in Formulae 2A, n is an integer greater than or equal to 1, BA is an n-butyl ammonium cation, and MA is a methyl ammonium cation.

16. The radiation detector according to claim 15, wherein the highly crystalline 2D layered perovskite material comprises a perovskite selected from the group consisting of $(BA)_2(MA)_2Pb_3I_{10}$, $(BA)_2(MA)_3Pb_4I_{13}$, and $(BA)_2(MA)_4Pb_5I_{16}$.

17. A radiation detector, comprising:
a p-i-n diode, comprising:
a p-type contact layer;
an n-type contact layer; and
an intrinsic layer between the p-type contact layer and the n-type contact layer, the intrinsic layer comprising a thin film comprising a highly crystalline 2D layered perovskite material represented by Formula 1A:

$$A_2B_{n-1}M_nX_{3n+1} \qquad \text{Formula 1A}$$

wherein, in Formula 1A, A is a first cation and comprises an inorganic cation comprising an alkali metal, an alkaline earth metal, and/or a lanthanide metal; B is a second organic or inorganic cation, M is a metal, X is an anion, and n is an integer greater than or equal to 1.

* * * * *